(12) United States Patent
Sung et al.

(10) Patent No.: US 12,433,104 B2
(45) Date of Patent: Sep. 30, 2025

(54) DISPLAY DEVICE AND METHOD OF MANUFACTURING THE SAME

(71) Applicant: Samsung Display Co., Ltd., Yongin-Si (KR)

(72) Inventors: Hyun Ah Sung, Suwon-si (KR); Tae Wook Kang, Seongnam-si (KR); Hyun Min Cho, Hwaseong-si (KR); Dong Min Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 562 days.

(21) Appl. No.: 17/953,098

(22) Filed: Sep. 26, 2022

(65) Prior Publication Data
US 2023/0180523 A1    Jun. 8, 2023

(30) Foreign Application Priority Data
Dec. 7, 2021 (KR) ................. 10-2021-0173696

(51) Int. Cl.
*H10K 59/121* (2023.01)
*H10D 86/40* (2025.01)
*H10D 86/60* (2025.01)
*H10K 59/35* (2023.01)
*H10K 59/65* (2023.01)

(52) U.S. Cl.
CPC ....... *H10K 59/1213* (2023.02); *H10D 86/423* (2025.01); *H10D 86/60* (2025.01); *H10K 59/353* (2023.02); *H10K 59/65* (2023.02)

(58) Field of Classification Search
CPC .. H10K 59/1213; H10K 59/353; H10K 59/65; H10D 86/60; H10D 86/423
See application file for complete search history.

(56) References Cited

U.S. PATENT DOCUMENTS

| 2022/0246687 | A1* | 8/2022 | Lee | H10K 59/123 |
| 2022/0310768 | A1* | 9/2022 | Long | H10K 59/1315 |
| 2024/0224638 | A1* | 7/2024 | Du | H10K 59/131 |
| 2024/0357892 | A1* | 10/2024 | Huang | G09G 3/3225 |

FOREIGN PATENT DOCUMENTS

KR    10-2017-0113066 A    10/2017

* cited by examiner

*Primary Examiner* — Fatima N Farokhrooz
(74) *Attorney, Agent, or Firm* — Innovation Counsel LLP

(57) ABSTRACT

Provided is a display device comprising a substrate including a first sub-display area and a main display area surrounding the first sub-display area, a first transistor disposed on the main display area without overlapping the first sub-display area, a via insulating layer to cover the first transistor, a first light emitting element to overlap the main display area without overlapping the first sub-display area, a second light emitting element to overlap the first sub-display area without overlapping the main display area, and a transparent oxide layer to overlap the first sub-display area without overlapping the main display area, wherein the transparent oxide layer includes a conductive portion and a non-conductive portion, the first light emitting element is disposed to overlap the first transistor while being connected thereto, and the second light emitting element is connected to the conductive portion of the transparent oxide layer.

19 Claims, 23 Drawing Sheets

DA: MDA, SDA
SDA: SDAa, SDAb

LEL: LEL1, LEL2

100: 130
SDA: SDAa, SDAb

LEL2_R: ANO, EML2_R, CAT
ACTL: ACT1, ACT5
GAT1: G1, G5
GAT2: CAP1
SD1: S5, D5
SD2: CNE5, CN5

DISPLAY DEVICE AND METHOD OF MANUFACTURING THE SAME

CROSS-REFERENCE TO RELATED APPLICATION

This application claims priority from Korean Patent Application No. 10-2021-0173696 filed on Dec. 7, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure generally relates to a display device and a method of manufacturing the same. More particularly, the present disclosure relates to a display device capable of preventing a light diffraction phenomenon in an area where a screen is displayed and light is transmitted and a method of manufacturing the same.

2. Description of the Related Art

An electronic device such as a smart phone, a tablet PC, a digital camera, a laptop computer, a navigation system and a smart television, which provides an image to a user, includes a display device for displaying an image.

The display device may include various optical devices such as an image sensor for capturing an image of a top surface, a proximity sensor for detecting whether a user is located close to the front surface of the display device, an illuminance sensor for detecting illuminance of the front surface of the display device, an iris sensor for recognizing a user's iris, and the like.

With diversification of electronic devices employing display devices, there is an increasing demand for display devices having various designs. For example, in the case of a smartphone, a display device capable of widening a display area by removing a hole disposed on the front surface of the display device is required. In this case, optical devices disposed in a hole disposed on the front surface of the display device may be disposed to overlap the display panel.

SUMMARY

Aspects of the disclosure provide a display device that prevents a light diffraction phenomenon in an area where a screen is displayed and light is transmitted.

Aspects of the disclosure also provide a method of manufacturing a display device that prevents a light diffraction phenomenon in an area where a screen is displayed and light is transmitted.

However, aspects of the disclosure are not restricted to those set forth herein. The above and other aspects of the disclosure will become more apparent to one of ordinary skill in the art to which the disclosure pertains by referencing the detailed description of the disclosure given below.

In the display device according to an embodiment of the disclosure, the light diffraction phenomenon in the area where a screen is displayed and light is transmitted may be improved.

The method of manufacturing a display device according to an embodiment of the disclosure may provide the display device in which the light diffraction phenomenon in the area where a screen is displayed and light is transmitted is improved.

However, the effects of the disclosure are not limited to the aforementioned effects, and various other effects are included in the present specification.

According to an embodiment of the disclosure, a display device comprises, a substrate comprising a first sub-display area and a main display area surrounding the first sub-display area; a first transistor disposed on the main display area of the substrate without overlapping the first sub-display area; a via insulating layer disposed on the substrate to cover the first transistor; a first light emitting element disposed on the via insulating layer to overlap the main display area without overlapping the first sub-display area; a second light emitting element disposed on the via insulating layer to overlap the first sub-display area without overlapping the main display area; and a transparent oxide layer disposed under the via insulating layer to overlap the first sub-display area without overlapping the main display area, wherein the transparent oxide layer comprises a conductive portion and a non-conductive portion, the first light emitting element is disposed to overlap the first transistor in the main display area while being electrically connected thereto, and the second light emitting element is electrically connected to the conductive portion of the transparent oxide layer in the first sub-display area.

In an embodiment, the substrate further comprises a second sub-display area disposed adjacent to the first sub-display area and surrounded by the main display area, the display device further comprising a second transistor disposed in the second sub-display area of the substrate without overlapping the first sub-display area, wherein the second transistor is disposed between the substrate and the via insulating layer and is electrically connected to the conductive portion by a connection electrode passing through the via insulating layer, and the second light emitting element is electrically connected to the second transistor by the conductive portion without overlapping the second transistor.

In an embodiment, the second sub-display area comprises: a first area in which the first transistor and the first light emitting element are disposed; and a second area in which the second transistor is disposed, wherein the transparent oxide layer does not overlap the first transistor.

In an embodiment, the second transistor comprises a drain electrode spaced apart from the transparent oxide layer, the display device further comprising a connection electrode disposed on the via insulating layer to overlap the second transistor, wherein the connection electrode is electrically connected to the drain electrode through a first contact hole penetrating the via insulating layer, and is electrically connected to the conductive portion of the transparent oxide layer through a second contact hole penetrating the via insulating layer while being spaced apart from the first contact hole.

In an embodiment, a display device may further comprise a buffer layer disposed on the substrate, wherein in the first sub-display area, the transparent oxide layer is in direct contact with a top surface of the buffer layer.

In an embodiment, the transparent oxide layer completely covers the first sub-display area.

In an embodiment, an area occupied by the non-conductive portion of the transparent oxide layer is larger than an area occupied by the conductive portion.

In an embodiment, a display device may further comprise an optical device disposed under the substrate, wherein the optical device overlaps the first sub-display area.

In an embodiment, the conductive portion and the non-conductive portion of the transparent oxide layer comprise the same material.

In an embodiment, a refractive index of the conductive portion and a refractive index of the non-conductive portion are substantially the same.

In an embodiment, the transparent oxide layer comprises indium gallium zinc oxide, and a thickness of each of the conductive portion and the non-conductive portion of the transparent oxide layer has a value greater than or equal to 1500 Å and smaller than or equal to 2000 Å.

In an embodiment, an electrical resistance of the conductive portion of the transparent oxide layer has a value greater than or equal to 600 Ω/□ and smaller than or equal to 700 Ω/□.

In an embodiment, each of the conductive portion and the non-conductive portion has a light transmittance of 80% or more in a visible light region.

According to another embodiment of the disclosure, a display device comprises, a substrate; a via insulating layer disposed on the substrate; a light emitting element disposed on the via insulating layer; a conductive portion disposed between the substrate and the via insulating layer and in direct contact with a bottom surface of the via insulating layer; and a non-conductive portion in direct contact with the conductive portion and a bottom surface of the via insulating layer, wherein the light emitting element is electrically connected to the conductive portion, and the conductive portion and the non-conductive portion comprise the same material.

In an embodiment, the light emitting element comprises a first light emitting element and a second light emitting element spaced apart from the first light emitting element, the conductive portion further comprises a first conductive portion electrically connected to the first light emitting element and a second conductive portion electrically connected to the second light emitting element, a light transmitting part is disposed between the first light emitting element and the second light emitting element, and the non-conductive portion is disposed between the first conductive portion and the second conductive portion to overlap the light transmitting part.

In an embodiment, a thickness of the conductive portion and a thickness of the non-conductive portion are substantially the same, and a bottom surface of the conductive portion and a bottom surface of the non-conductive portion are disposed on one plane.

In an embodiment, the conductive portion and the non-conductive portion are disposed under the via insulating layer to completely cover a bottom surface of the via insulating layer.

In an embodiment, uniformity of the conductive portion is higher than uniformity of the non-conductive portion.

In an embodiment, a refractive index of the conductive portion and a refractive index of the non-conductive portion are substantially the same.

In an embodiment, the conductive portion and the non-conductive portion comprise indium gallium zinc oxide, and a thickness of each of the conductive portion and the non-conductive portion has a value greater than or equal to 1500 Å and smaller than or equal to 2000 Å.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Hereinafter, embodiments will be described in detail with reference to the accompanying drawings.

Figure 1:
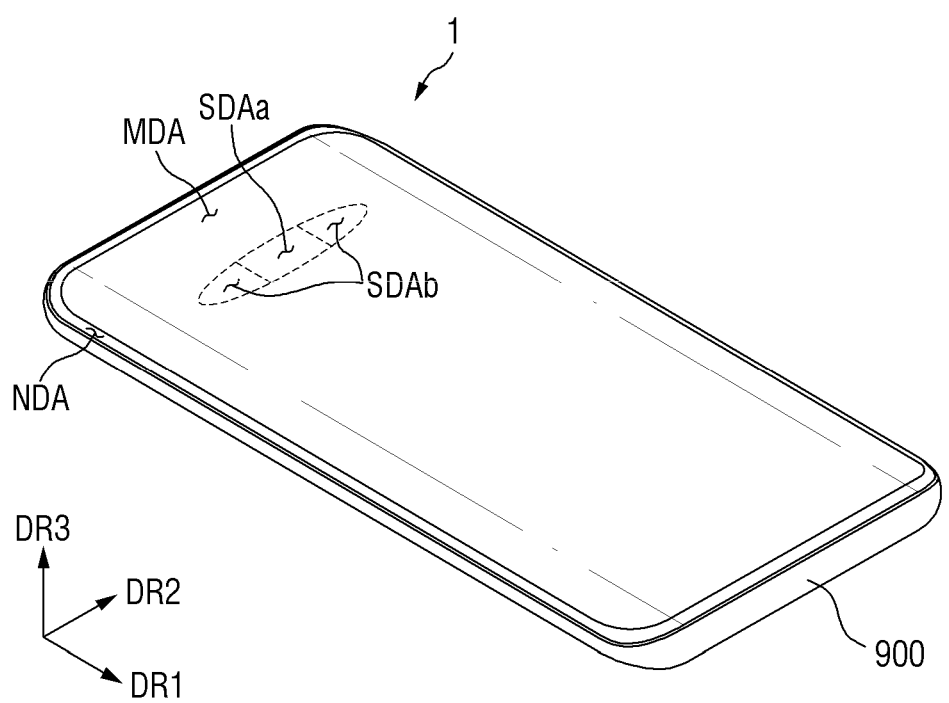
FIG. 1 is a perspective view showing a display device according to one embodiment.
Figure 2:
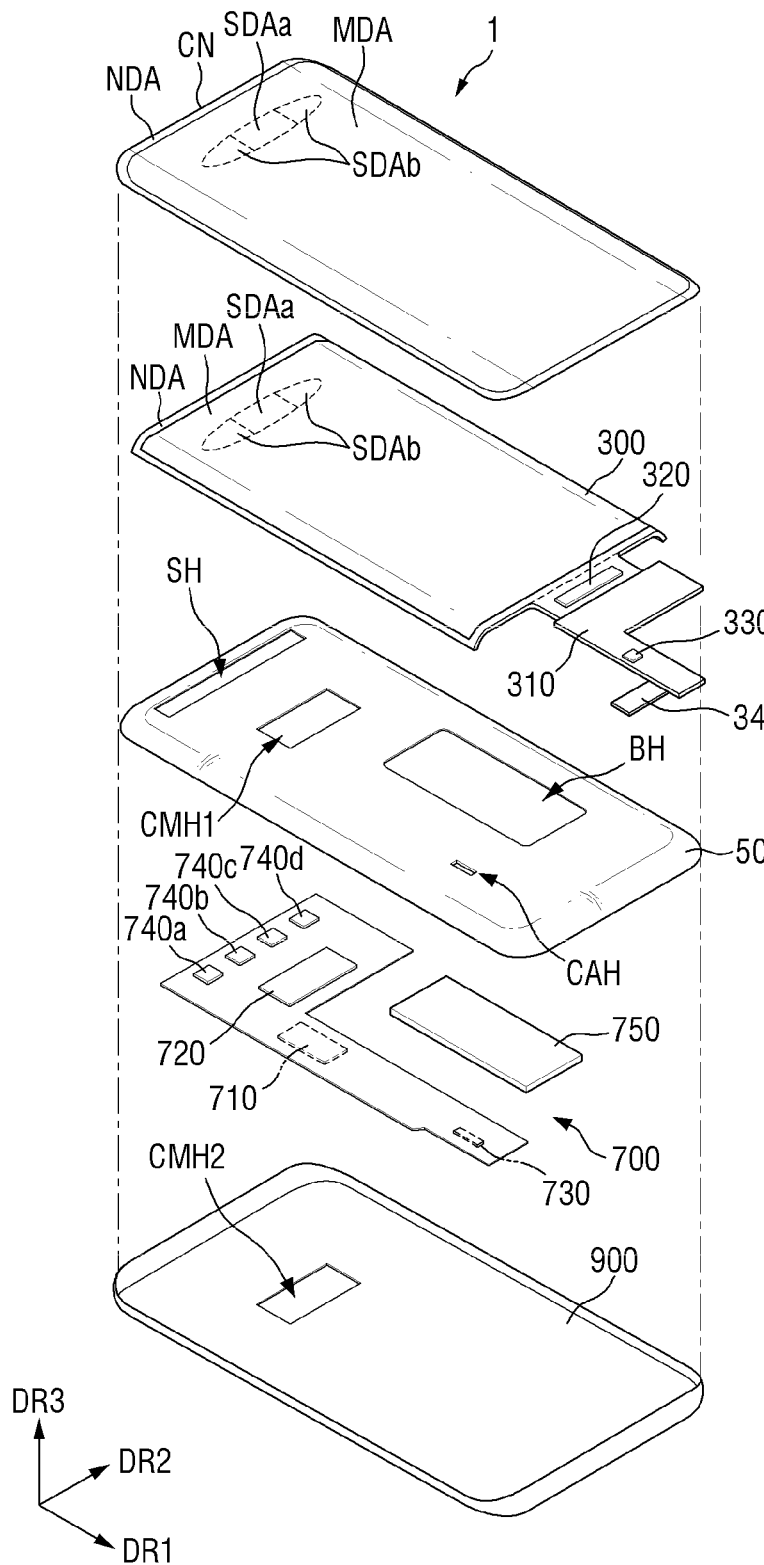
FIG. 2 is an exploded perspective view illustrating the structure of the display device of FIG. 1.
Figure 3:
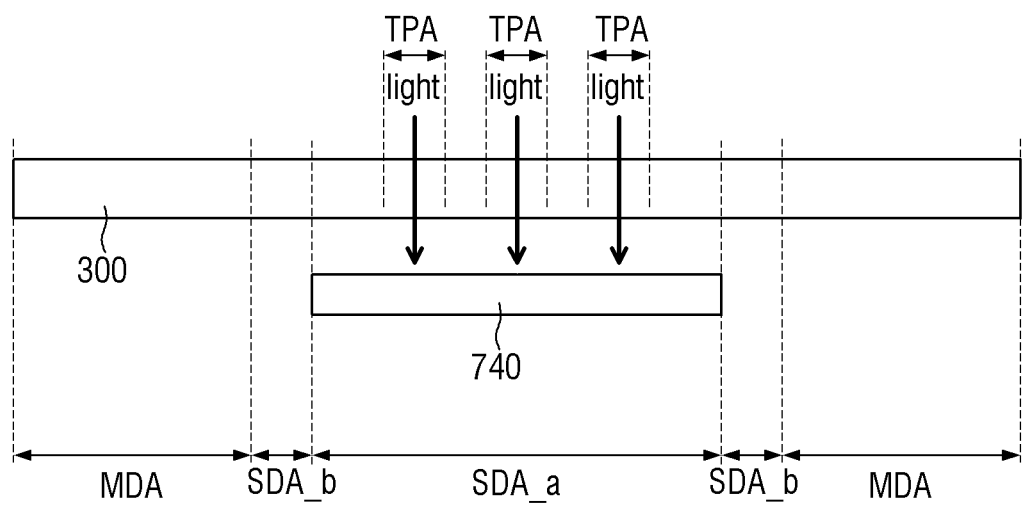
FIG. 3 is a plan view illustrating an arrangement relationship between a display panel and an image sensor.

FIG. 1 is a perspective view showing a display device according to one embodiment. FIG. 2 is an exploded perspective view illustrating the structure of the display device of FIG. 1. FIG. 3 is a plan view illustrating an arrangement relationship between a display panel and an image sensor.

Referring to FIGS. 1, 2, and 3, a display device 1 according to one embodiment may be applied to portable electronic devices such as a mobile phone, a smartphone, a tablet personal computer, a mobile communication terminal, an electronic organizer, an electronic book, a portable multimedia player (PMP), a navigation system, an ultra mobile PC (UMPC) or the like. Alternatively, the display device 1 according to one embodiment may be applied as a display unit of a television, a laptop, a monitor, a billboard, or an Internet-of-Things (IoT) terminal.

The display device 1 has a three-dimensional shape. For example, the display device 1 may have a rectangular parallelepiped shape or a three-dimensional shape similar thereto. In the drawing, the direction parallel to the first side of the display device 1 is indicated as a first direction DR1, the direction parallel to the second side of the display device 1 is indicated as a second direction DR2, and the thickness direction of the display device 1 is indicated as a third direction DR3. In the following specification, unless otherwise stated, "direction" may refer to both directions extending along the direction. Further, when it is necessary to distinguish both "directions" extending in both sides, one side will be referred to as "one side in the direction" and the other side will be referred to as "the other side in the direction." Referring to FIG. 1, a direction in which an arrow is directed is referred to as one side, and the opposite direction is referred to as the other side. The first direction DR1 and the second direction DR2 may be perpendicular to each other, the first direction DR1 and the third direction DR3 may be perpendicular to each other, and the second direction DR2 and the third direction DR3 may be perpendicular to each other.

The display device 1 may have a planar shape similar to a quadrilateral shape. For example, the display device 1 may have a planar shape similar to a quadrilateral shape having long sides in the first direction DR1 and short sides in the second direction DR2, as shown in FIG. 1. A corner where the long side in the first direction DR1 and the short side in the second direction DR2 meet may be right-angled or rounded with a predetermined curvature. The planar shape of the display device 1 is not limited to a quadrilateral shape, and may be formed in a shape similar to another polygonal shape, a circular shape, or elliptical shape.

In some embodiments, the display device 1 may be formed to be flat, or two sides facing each other may be formed to be curved, but the disclosure is not limited thereto. For example, the display device 1 may be formed such that the left and right sides are formed to be curved, or all of the upper side, the lower side, the left side, and the right side are formed to be curved.

Hereinafter, one surface of the display device 1 in the third direction DR3 may be a top surface, and the other surface of the display device 1 in the third direction DR3 may be a bottom surface.

The display device 1 may include a display area DA in which a screen is displayed and a non-display area NDA in which a screen is not displayed. In some embodiments, the non-display area NDA may be disposed to surround the edge of the display area DA, but the disclosure is not limited thereto.

The display area DA may include a main display area MDA having a relatively high pixel per inch (PPI) and a sub-display area SDA having a relatively low pixel per inch (PPI). A high pixel per inch (PPI) may mean that the number of sub-pixels disposed per unit area is large.

The main display area MDA may occupy most of the display area DA. The main display area MDA may include first sub-pixels SPX1 for displaying an image as will be described later. A detailed description thereof will be given later.

The sub-display area SDA may include a first sub-display area SDAa and a second sub-display area SDAb disposed between the first sub-display area SDAa and the main display area MDA. The first sub-display area SDAa may include a light transmitting part TPA that transmits light and second sub-pixels SPX2 for displaying an image as will be described below. Therefore, the light transmittance of the first sub-display area SDAa may be higher than that of the main display area MDA. The second sub-display area SDAb may include second transistor units TRA2 of the second sub-pixel SPX2 as will be described later. A detailed description thereof will be given later. In some embodiments, the main display area MDA may be a first display area, the first sub-display area SDAa may be a second display area, and the second sub-display area SDAb may be a third display area.

In some embodiments, the sub-display area SDA may be disposed at the inner side of the main display area MDA, and the main display area MDA may be disposed to surround the sub-display area SDA, but the disclosure is not limited thereto. For example, the sub-display area SDA may be disposed on one side of the main display area MDA. In some embodiments, the sub-display area SDA may have an elliptical shape, but is not limited thereto. For example, the sub-display area SDA may have a rectangular shape. In some embodiments, the second sub-display area SDAb may be disposed on both sides of the first sub-display area SDAa in the second direction DR2, but the disclosure is not limited thereto. In some embodiments, one sub-display area SDA may be formed, but the disclosure is not limited thereto. For example, a plurality of sub-display areas SDA may be formed.

Meanwhile, the main display area MDA, the first sub-display area SDAa, and the second sub-display area SDAb of the display device 1 may be equally applied to each component of the display device 1 to be described later. For example, a part of a display panel 300 to be described later that overlaps the main display area MDA of the display device 1 in the third direction DR3 may be the main display area MDA of the display panel 300, a part of the display panel 300 that overlaps the first sub-display area SDAa of the display device 1 in the third direction DR3 may be the first sub-display area SDAa of the display panel 300, and a part of the display panel 300 that overlaps the second sub-display area SDAb of the display device 1 in the third direction DR3 may be the second sub-display area SDAb of the display panel 300.

The display device 1 according to one embodiment includes a cover window CW, the display panel 300, a bracket 500, an optical device 740, and a lower cover 900.

The cover window CW may serve to protect the front surface of the display panel 300. The cover window CW may be disposed on the display panel 300 to cover the top surface of the display panel 300.

The display panel 300 where sub-pixels are disposed may serve to provide a screen to a user. The display panel 300 may be disposed below the cover window CW. The display panel 300 may be a light emitting display panel including a light emitting element. For example, the display panel 300 may be an organic light emitting display panel using an organic light emitting diode including an organic light emitting layer, a micro light emitting diode display panel using a micro LED, a quantum dot light emitting display panel using a quantum dot light emitting diode including a quantum dot light emitting layer, or an inorganic light emitting display panel using an inorganic light emitting element including an inorganic semiconductor. For simplicity of description, the following description is directed to the case where the display panel 300 is an organic light emitting display panel. Further, a detailed description of the structure of the display panel 300 will be given later.

One surface of the display panel 300 in the third direction DR3 may be the top surface on which the cover window CW is disposed, and the other surface of the display panel 300 in the third direction DR3 may be the bottom surface on which the bracket 500 to be described later is disposed.

A display circuit board 310 and a display driving circuit 320 may be attached to one side of the display panel 300 in the first direction DR1. The display circuit board 310 may be a flexible printed circuit board which is bendable, a rigid printed circuit board which is solid to be hardly bent, or a composite printed circuit board having both of the rigid printed circuit board and the flexible printed circuit board.

The display driving circuit 320 may receive control signals and power voltages through the display circuit board 310, and may serve to generate and output signals and voltages for driving the display panel 300. In some embodiments, the display driving circuit 320 may be formed as an integrated circuit (IC) and attached to a sub-area SBA of the display panel 300 by a chip on glass (COG) method, a chip on plastic (COP) method, or an ultrasonic method, but the disclosure is not limited thereto. For example, the display driving circuit 320 may be attached onto the display circuit board 310.

A touch driving circuit 330 may be disposed on the display circuit board 310. The touch driving circuit 330 may be formed as an integrated circuit and attached to the top surface of the display circuit board 310. The touch driving circuit 330 may be electrically connected to the touch electrodes of a touch sensor layer TSL of the display panel 300 through the display circuit board 310. The touch driving circuit 330 may output a touch driving signal to the touch electrodes and sense the voltage charged in the capacitances of the touch electrodes.

The touch driving circuit 330 may generate touch data according to the change in the electrical signal sensed at each of the touch electrodes to transmit the touch data to a main processor 710 to be described later. Then, the main processor 710 may serve to analyze the touch data to generate touch coordinates at which a touch occurs.

Further, a power supply unit may be additionally disposed on the display circuit board 310 to supply display driving voltages for driving the display driving circuit 320.

The bracket 500 may be disposed under the display panel 300.

The bracket 500 may serve to fasten the lower cover 900 to be described later. A first camera hole CMH1 into which a first camera sensor 720 is inserted, a battery hole BH in which a battery 750 is disposed, a cable hole CAH through which a cable (not shown) connected to the display circuit board 310 passes, and a light transmission hole SH in which the optical device 740 is disposed are defined in the bracket 500. Alternatively, the bracket 500 may be formed so as not to overlap the first sub-display area SDAa of the display panel 300 without including the light transmission hole SH. The bracket 500 may include plastic, metal, or both plastic and metal.

The main circuit board 700 may be disposed under the bracket 500.

The main circuit board 700 may be a printed circuit board SUB or a flexible printed circuit board SUB. The main circuit board 700 may include a main processor 710, a first camera sensor 720, a main connector 730, the optical device 740, and battery 750. The optical device 740 may include a proximity sensor 740a, an illuminance sensor 740b, an iris sensor 740c, a second camera sensor 740d, or the like.

The main processor 710 may serve to output a circuit signal for controlling all functions of the display device 1. For example, the main processor 710 may control the display device 1 in response to sensor signals inputted from the first camera sensor 720, the proximity sensor 740a, the illuminance sensor 740b, the iris sensor 740c, and the second camera sensor 740d.

The first camera sensor 720 may be disposed on both the top and bottom surfaces of the main circuit board 700, the main processor 710 may be disposed on the top surface of the main circuit board 700, and the main connector 730 may be disposed on the bottom surface of the main circuit board 700. The proximity sensor 740a, the illuminance sensor 740b, the iris sensor 740c, and the second camera sensor 740d may be disposed on the top surface of the main circuit board 700.

The first camera sensor 720 may serve to process first image data such as a still image or a moving image of the other side of the display device 1 in the third direction DR3 that is obtained by an image sensor and output it to the main processor 710. The first camera sensor 720 may be a complementary metal-oxide-semiconductor (CMOS) image sensor or a charge-coupled device (CCD) sensor. The first camera sensor 720 may be exposed to the bottom surface of the lower cover 900 by a second camera hole CMH2 to be described later, thereby capturing an image of a background or an object disposed below the display device 1. The first camera sensor 720 may be a complementary metal-oxide-semiconductor (CMOS) image sensor or a charge-coupled device (CCD) sensor. The first camera sensor 720 may be exposed to the bottom surface of the lower cover 900 by a second camera hole CMH2 to thereby capture an image of a background or an object disposed below the display device 1.

The proximity sensor 740a may serve to detect whether there is an object located close to the top surface of the display device 1. The proximity sensor 740a may include a light source that outputs light and a light receiver that receives light reflected by an object. The proximity sensor 740a may determine whether there is an object located close to the top surface of the display device 1 according to the amount of light reflected by the object. Since the proximity sensor 740a is disposed to overlap the light transmission hole SH and the first sub-display area SDAa of the display panel 300 in the third direction DR3, it is possible to easily sense whether there is an object located close to the top surface of the display device 1.

The illuminance sensor 740b may serve to detect the brightness of the top surface of the display device 1. The illuminance sensor 740b may include a resistor whose resistance value changes according to the brightness of the incident light. The illuminance sensor 740b may determine the brightness of the top surface of the display device 1 according to the resistance value of the resistor. Since the illuminance sensor 740b is disposed to overlap the light transmission hole SH and the first sub-display area SDAa of the display panel 300 in the third direction DR3, it is possible to sense the brightness of the top surface of the display device 1.

The iris sensor 740c may a sensor for detecting whether the image of the user's iris is the same as the iris image previously stored in the memory. Since the iris sensor 740c is disposed to overlap the light transmission hole SH and the first sub-display area SDAa of the display panel 300 in the third direction DR3, it is possible to easily capture an image of a user's iris disposed above the display device 1.

The second camera sensor 740d may serve to process second image data such as a still image or a moving image of one side of the display device 1 in the third direction DR3 that is obtained by the image sensor and output it to the main processor 710. The second camera sensor 740d may be a complementary metal-oxide-semiconductor (CMOS) image sensor or a charge-coupled device (CCD) sensor. The number of sub-pixels of the second camera sensor 740d may be smaller than the number of sub-pixels of the first camera sensor 720, and the size of the second camera sensor 740d may be smaller than the size of the first camera sensor 720. Since the second camera sensor 740d is disposed to overlap the light transmission hole SH and the first sub-display area SDAa of the display panel 300 in the third direction DR3, it is possible to capture an image of an object or a background disposed above the display device 1.

Although FIG. 2 illustrates that the first sub-display area SDAa overlaps all of the proximity sensor 740a, the illuminance sensor 740b, the iris sensor 740c, and the second camera sensor 740d, the disclosure is not limited thereto. For example, the number of first sub-display areas SDAa may depend on the number of optical devices 740. In this case, the plurality of first sub-display areas SDAa may be disposed to correspond one-to-one to the proximity sensor 740a, the illuminance sensor 740b, the iris sensor 740c, and the second camera sensor 740d. Hereinafter, for simplicity of description, the case where the optical device 740 is the second camera sensor 740d will be mainly described.

The cable having passed through the cable hole CAH of the bracket 500 may be connected to the main connector 730. Thus, the main circuit board 700 may be electrically connected to the display circuit board 310.

The battery 750 may serve to supply power to the display device 1. The battery 750 may overlap the battery hole BH of the bracket 500.

The lower cover 900 may serve to form an external appearance of the bottom surface of the display device 1. The lower cover 900 may be disposed below the main circuit board 700 and the battery 750. The lower cover 900 may be fixed by being fastened to the bracket 500. The lower cover 900 may include plastic, metal, or both plastic and metal.

The second camera hole CMH2 exposing the bottom surface of the first camera sensor 720 may be formed in the lower cover 900.

As described above, the optical device 740 includes the light transmitting part TPA that transmits light and is disposed to overlap the first sub-display area SDAa having a relatively high light transmittance, so that the optical device 740 may detect light incident on the top surface of the display device 1 through the first sub-display area SDAa even though it overlaps the display panel 300.

However, when the stacked structure of the display panel 300 is different for each portion in the light transmitting part TPA of the first sub-display area SDAa, a diffraction phenomenon may occur due to a path difference in transmitted light. In this case, a defect such as distortion of an image sensed by the optical device 740 may occur. Accordingly, it is necessary to prevent a light diffraction phenomenon occurring in the light transmitting part TPA of the first sub-display area SDAa. Hereinafter, the structure of the display panel 300 for preventing a light diffraction phenomenon will be described in detail.

Figure 4:
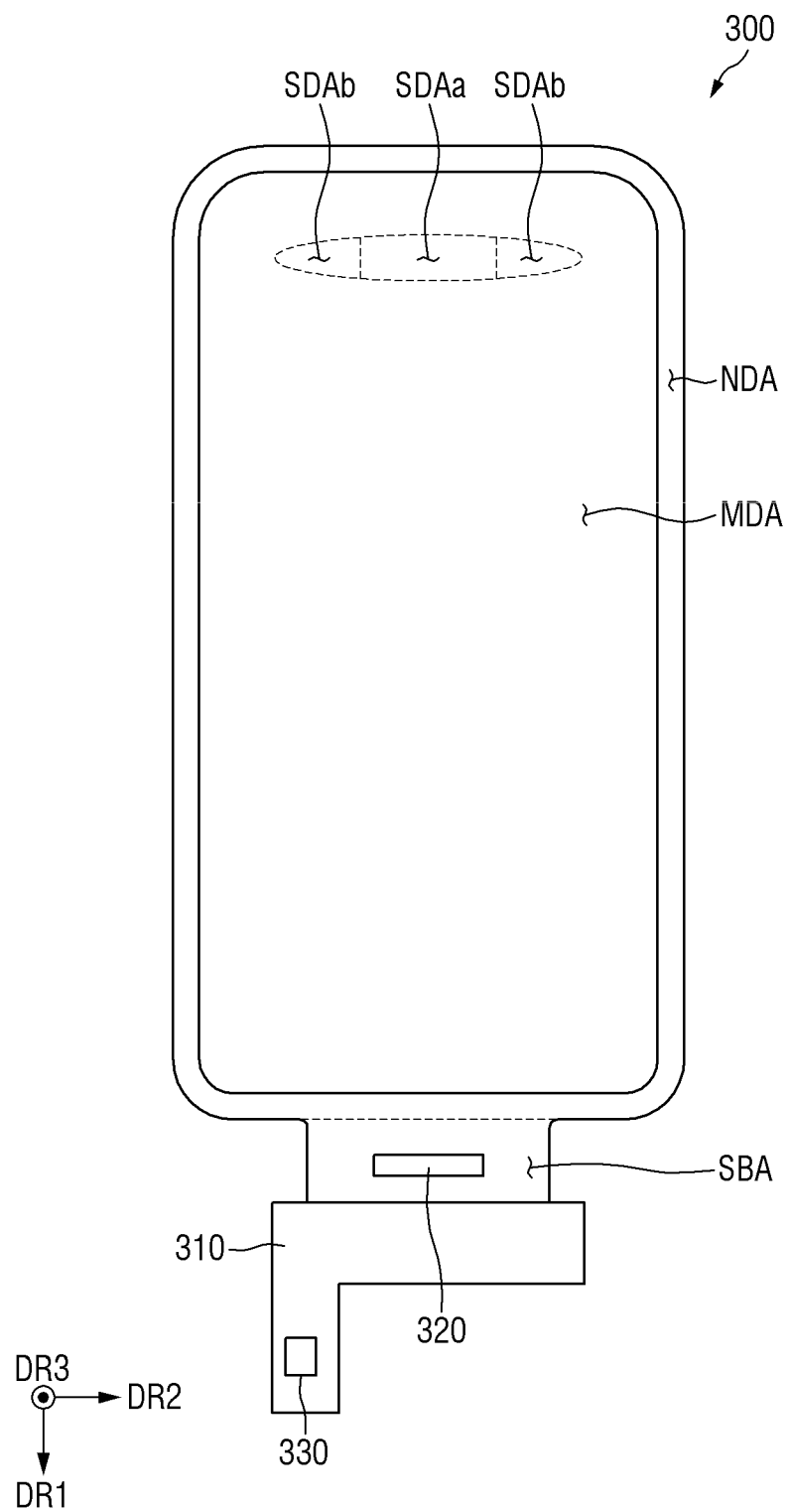
FIG. 4 is a plan view illustrating the structure of a display panel.
Figure 5:
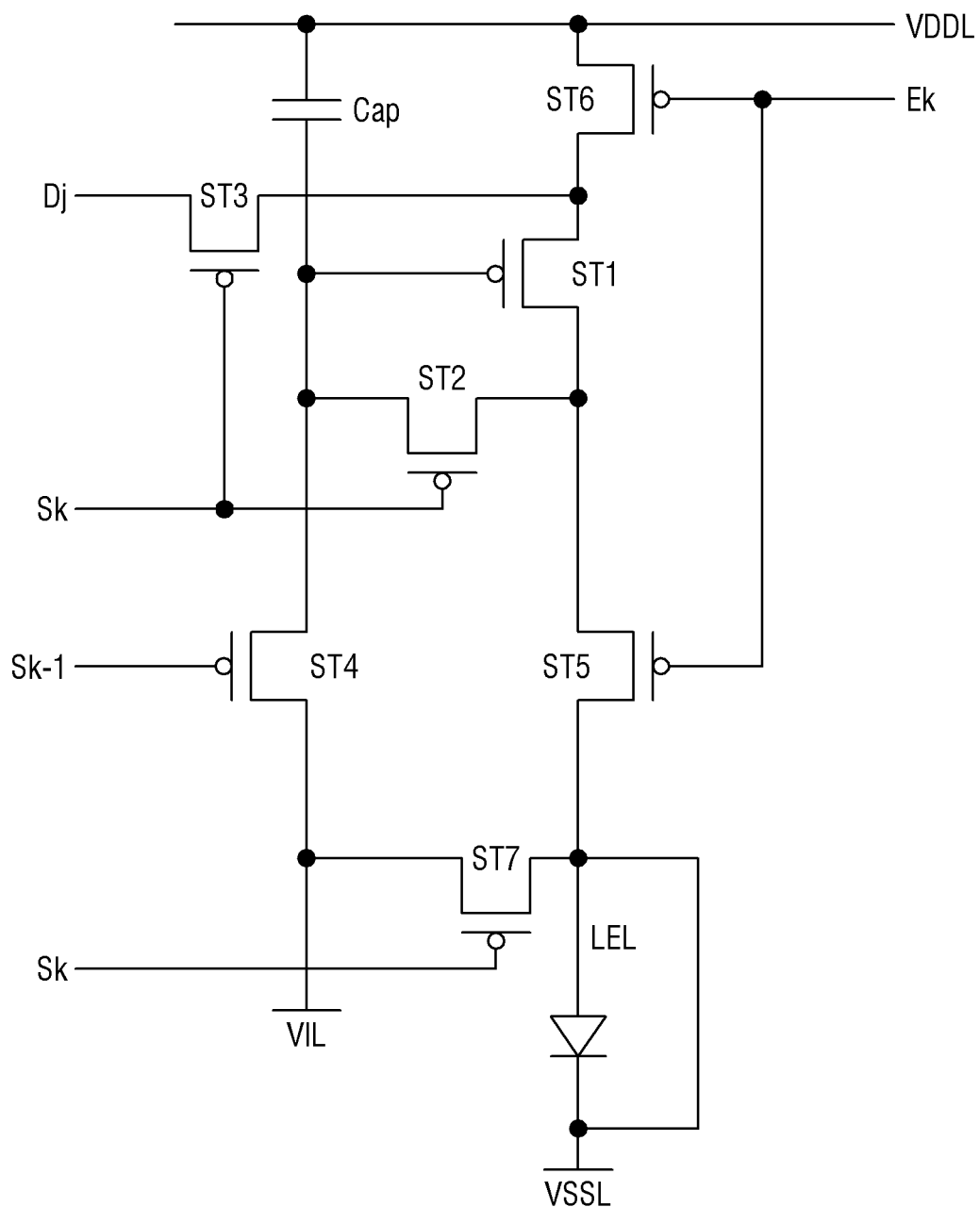
FIG. 5 is a circuit diagram illustrating the circuit structure of a sub-pixel.
Figure 6:
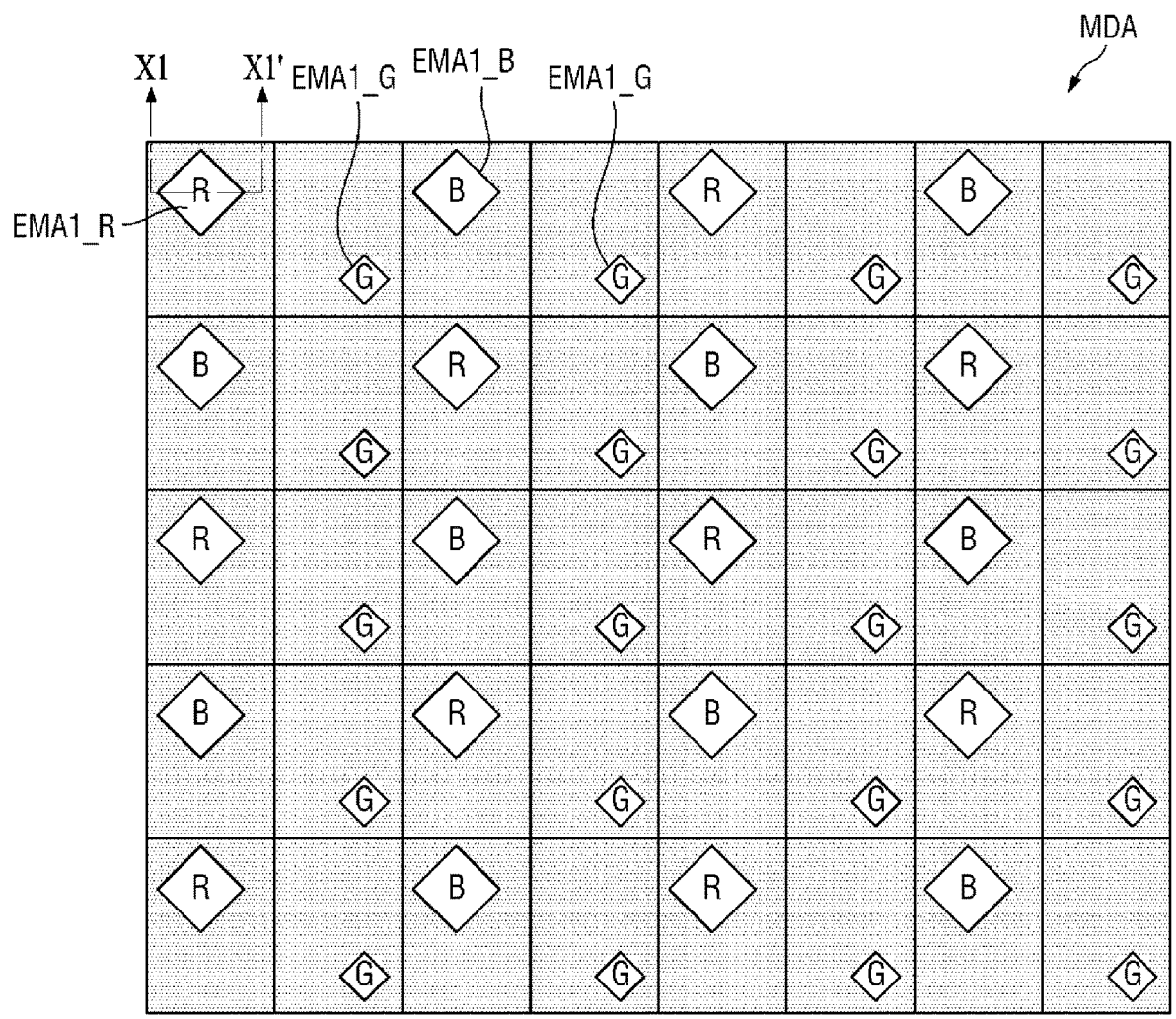
FIG. 6 is a plan view illustrating schematic arrangement of sub-pixels in a main display area.
Figure 7:
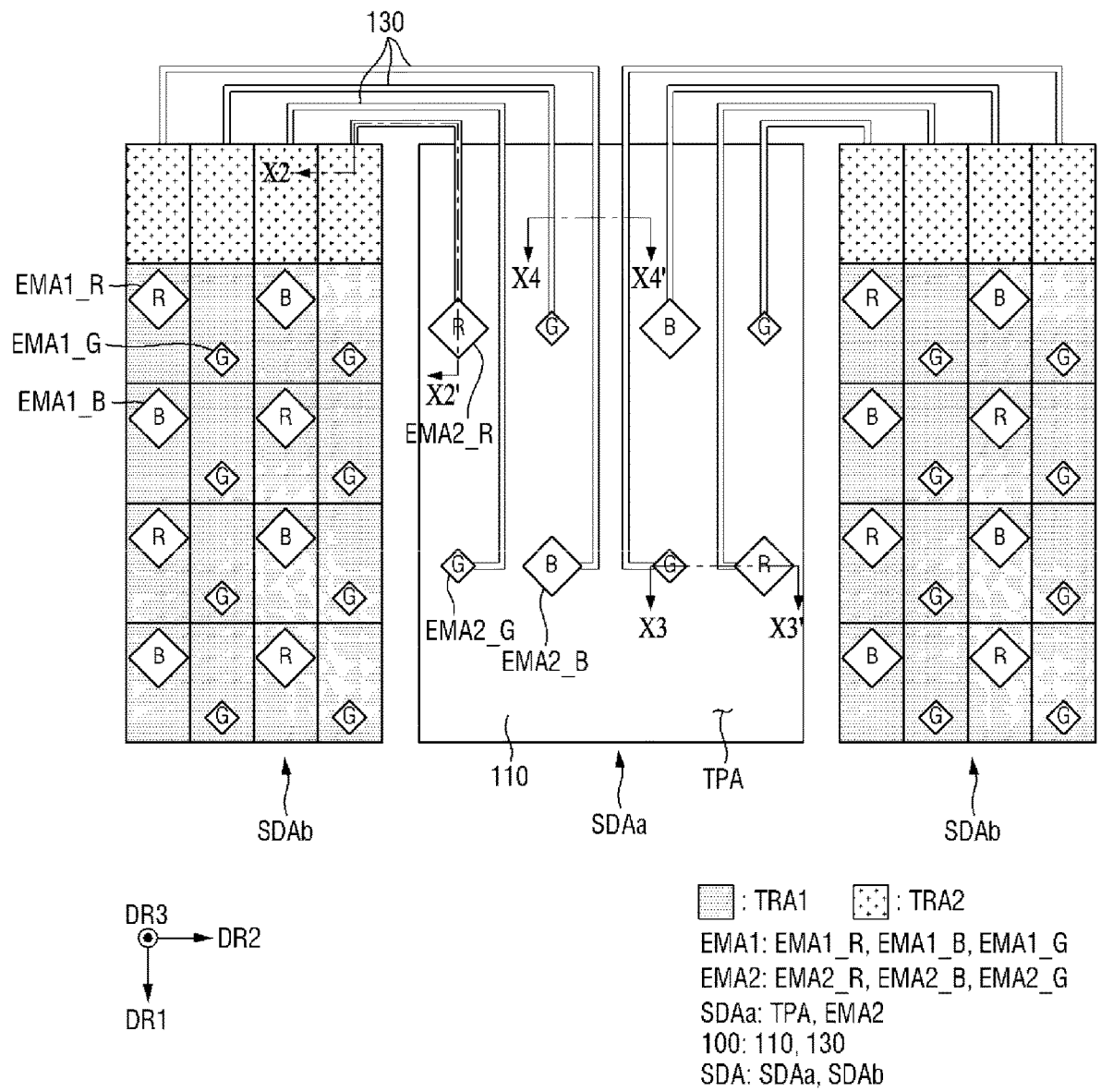
FIG. 7 is a plan view illustrating schematic arrangement of sub-pixels in a sub-display area.

FIG. 4 is a plan view illustrating the structure of a display panel. FIG. 5 is a circuit diagram illustrating the circuit structure of a sub-pixel. FIG. 6 is a plan view illustrating schematic arrangement of sub-pixels in a main display area. FIG. 7 is a plan view illustrating schematic arrangement of sub-pixels in a sub-display area.

Referring to FIG. 4, the display panel 300 may include the main display area MDA, the first sub-display area SDAa, the second sub-display area SDAb, and the non-display area NDA. Since the description of the main display area MDA, the first sub-display area SDAa, the second sub-display area SDAb, and the non-display area NDA is the same as the above description, the detailed description thereof will be omitted.

Referring to FIG. 5, the sub-pixels disposed in the display area DA of the display panel 300 may be connected to a $(k-1)^{th}$ scan line Sk-1, a $k^{th}$ scan line Sk, and a $j^{th}$ data line Dj. k and j may be natural numbers of 1 or more. Further, the sub-pixel may be connected to a first driving voltage line VDDL to which a first driving voltage is supplied, an initialization voltage line VIL to which an initialization voltage is supplied, and a second driving voltage line VSSL to which a second driving voltage having a voltage value lower than that of the first driving voltage is supplied. The sub-pixels disposed in the display area DA may be divided into a first sub-pixel SPX1 disposed in the main display area MDA and a second sub-pixel SPX2 disposed in the first sub-area.

The sub-pixel includes a transistor unit including a plurality of thin film transistors and a light emitting element LEL. The transistor unit includes a driving thin film transistor DT and a switching thin film transistor SW. The driving thin film transistor DT may receive the first driving voltage or the second driving voltage and supply a driving current to the light emitting element LEL, and the switching thin film transistor SW may transmit a data signal to the driving thin film transistor DT.

The transistor unit may include a first thin film transistor ST1 as the driving thin film transistor DT, and may include a second thin film transistor ST2, a third thin film transistor ST3, a fourth thin film transistor ST4, a fifth thin film transistor ST5, a sixth thin film transistor ST6, and a seventh thin film transistor ST7 as the switching thin film transistors SW. In other words, the transistor unit may be a concept including a plurality of thin film transistors, i.e., the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7. Further, the transistor unit may be divided into a first transistor unit TRA1 and a second transistor unit TRA2 depending on an arrangement position. Specifically, the transistor unit disposed in the main display area MDA may be the first transistor unit TRA1, and the transistor unit disposed in the second sub-display area SDAb may be the second transistor unit TRA2.

The light emitting element LEL may include a first electrode, a second electrode, and a light emitting layer. Further, the light emitting element may be divided into a first light emitting element LEL1 and a second light emitting element LEL2 depending on an arrangement position. Specifically, the light emitting element disposed in the main display area MDA and the second sub-display area SDAb may be the first light emitting element LEL1, and the light emitting element disposed in the first sub-display area SDAa may be the second light emitting element LEL2. Meanwhile, in the light emitting layer of the light emitting element, an emission area may be defined by a pixel defining layer PDL to be described later. Accordingly, the emission area of the first light emitting element LEL1 may be a first emission area EMA1 (see FIGS. 6 and 7), and the emission area of the second light emitting element LEL2 may be a second emission area EMA2 (see FIG. 7).

The first sub-pixel SPX1 (see FIG. 8) may include the first transistor unit TRA1 disposed in the main display area MDA and the second sub-display area SDAb and the first light emitting element LEL1 disposed on the first transistor unit TRA1 (see FIGS. 6 and 7), and the second sub-pixel SPX2 (see FIG. 9) may include the second transistor unit TRA2 disposed in the second sub-display area SDAb and the second light emitting element LEL2 disposed in the first sub-display area SDAa (see FIG. 7). In this case, each of the first transistor unit TRA1 and the second transistor unit TRA2 may include the above-described first thin film transistor ST1, second thin film transistor ST2, third thin film transistor ST3, fourth thin film transistor ST4, fifth thin film transistor ST5, sixth thin film transistor ST6, and seventh thin film transistor ST7.

The first thin film transistor ST1 may include a first gate electrode, a first semiconductor active region, a first electrode, a second electrode, or the like. The first thin film transistor ST1 controls a drain-source current flowing between the first electrode and the second electrode in response to the data voltage applied to the first gate electrode. The driving current flowing through the channel of the first thin film transistor ST1 is proportional to the square of the difference between the threshold voltage and the voltage between the first gate electrode and the first electrode of the first thin film transistor ST1 as shown in Equation 1.

$$\text{Ids} = k' \times (\text{Vgs} - \text{Vth})^2 \quad \text{[Equation 1]}$$

In Equation 1, k' is a proportional coefficient determined by the structure and physical characteristics of the first thin film transistor ST1, Vgs is a gate-source voltage of the first thin film transistor ST1, Vth is a threshold voltage of the first thin film transistor ST1, and Ids is a driving current.

The light emitting element LEL may serve to emit light in response to the driving current. A light emission amount of the light emitting element LEL may be proportional to the driving current. The light emitting element LEL may include a first electrode, a second electrode, and a light emitting layer disposed between the first electrode and the second electrode. The first electrode may be an anode electrode and the second electrode may be a cathode electrode.

The first electrode of the light emitting element LEL may be connected to the first electrode of the seventh thin film transistor ST7 and the second electrode of the fifth thin film transistor ST5 which will be described later, and the second electrode thereof may be connected to the second driving voltage line VSSL.

The second thin film transistor ST2 is turned on by the scan signal of the $k^{th}$ scan line Sk to connect the first gate electrode and the second electrode of the first thin film transistor ST1. That is, when the second thin film transistor ST2 is turned on, the first gate electrode and the second electrode of the first thin film transistor ST1 are connected and, thus, the first thin film transistor ST1 operates as a diode. The second thin film transistor ST2 may include a second gate electrode, a second semiconductor active region, a first electrode, and a second electrode. The second gate electrode may be connected to the $k^{th}$ scan line Sk, the first electrode of the second thin film transistor ST2 may be connected to the second electrode of the first thin film transistor ST1, and the second electrode of the second thin film transistor ST2 may be connected to the first gate electrode of the first thin film transistor ST1.

The third thin film transistor ST3 is turned on by the scan signal of the $k^{th}$ scan line Sk to connect the first electrode of the first thin film transistor ST1 and the $j^{th}$ data line Dj. The third thin film transistor ST3 may include a third gate electrode, a third semiconductor active region, a first electrode, and a second electrode. The third gate electrode of the third thin film transistor ST3 may be connected to the $k^{th}$ scan line Sk, the first electrode of the third thin film transistor ST3 may be connected to the first electrode of the first thin film transistor ST1, and the second electrode of the third thin film transistor ST3 may be connected to the $j^{th}$ data line Dj.

The fourth thin film transistor ST4 is turned on by the scan signal of the $(k-1)^{th}$ scan line Sk-1 to connect the first gate electrode of the first thin film transistor ST1 to the initialization voltage line VIL. The first gate electrode of the first thin film transistor ST1 may be discharged to an initialization voltage of the initialization voltage line VIL. The fourth thin film transistor ST4 may include a fourth gate electrode, a fourth semiconductor active region, a first electrode, and a second electrode. The fourth gate electrode of the fourth thin film transistor ST4 may be connected to the $(k-1)^{th}$ scan line Sk-1, the first electrode of the fourth thin film transistor ST4 may be connected to the first gate electrode of the first thin film transistor ST1, and the second electrode of the fourth thin film transistor ST4 may be connected to the initialization voltage line VIL.

The fifth thin film transistor ST5 is connected between the second electrode of the first thin film transistor ST1 and the first electrode of the light emitting element LEL. The fifth thin film transistor ST5 is turned on by the emission control signal of a $k^{th}$ emission line Ek to connect the second electrode of the first thin film transistor ST1 to the first electrode of the light emitting element LEL. The fifth thin film transistor ST5 may include a fifth gate electrode, a fifth semiconductor active region, a first electrode, and a second electrode. The fifth gate electrode of the fifth thin film transistor ST5 may be connected to the $k^{th}$ emission line Ek, the first electrode of the fifth thin film transistor ST5 may be connected to the second electrode of the first thin film transistor ST1, and the second electrode of the fifth thin film transistor ST5 may be connected to the first electrode of the light emitting element LEL.

The sixth thin film transistor ST6 is turned on by the emission control signal of the $k^{th}$ emission line Ek to connect the first electrode of the first thin film transistor ST1 to the first driving voltage line VDDL. The sixth thin film transistor ST6 may include a sixth gate electrode, a sixth semiconductor active region, a first electrode, and a second electrode. The sixth gate electrode of the sixth thin film transistor ST6 may be connected to the $k^{th}$ emission line Ek, the first electrode of the sixth thin film transistor ST6 may be connected to the first driving voltage line VDDL, and the second electrode of the sixth thin film transistor ST6 may be connected to the first electrode of the first thin film transistor ST1. When both the fifth thin film transistor ST5 and the sixth thin film transistor ST6 are turned on, the driving current may be supplied to the light emitting element LEL.

The seventh thin film transistor ST7 is turned on by the scan signal of the $k^{th}$ scan line Sk to connect the first electrode of the light emitting element LEL to the initialization voltage line VIL. The first electrode of the light emitting element LEL may be discharged to the initialization voltage. The seventh thin film transistor ST7 may include a seventh gate electrode, a seventh semiconductor active region, a first electrode, and a second electrode. The seventh gate electrode of the seventh thin film transistor ST7 may be connected to the $k^{th}$ scan line Sk, the first electrode of the seventh thin film transistor ST7 may be connected to the first electrode of the light emitting element LEL, and the second electrode of the seventh thin film transistor ST7 may be connected to the initialization voltage line VIL.

The sub-pixel may further include a capacitor Cap. The capacitor Cap is formed between the first gate electrode of the first thin film transistor ST1 and the first driving voltage line VDDL. One electrode of the capacitor Cap may be connected to the first gate electrode of the first thin film transistor ST1, and the other electrode thereof may be connected to the first driving voltage line VDDL.

When the first electrode of each of the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 is a source electrode, the second electrode thereof may be a drain electrode. Alternatively, when the first electrode of each of the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 is a drain electrode, the second electrode thereof may be a source electrode.

Each of the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 may include a semiconductor active region as described above. The first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 may include the semiconductor active regions made of polycrystalline silicon, but the disclosure is not limited thereto.

When the semiconductor active regions of the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 are made of polycrystalline silicon, they may be formed by a low-temperature polycrystalline silicon process. Further, although FIG. 5 has mainly described the case where the first thin film transistor ST1, the second thin film transistor ST2, the third thin film transistor ST3, the fourth thin film transistor ST4, the fifth thin film transistor ST5, the sixth thin film transistor ST6, and the seventh thin film transistor ST7 are formed as p-type thin film transistors, the disclosure is not limited thereto, and some or all of them may be formed as n-type thin film transistors.

Referring to FIGS. 6 and 7, the display panel 300 according to one embodiment may include a plurality of sub-pixels. The sub-pixels may be divided into the first sub-pixel SPX1 and the second sub-pixel SPX2 depending on the arrangement positions as described above. In other words, the first sub-pixel SPX1 may be disposed in the main display area MDA and the second sub-display area SDAb, and the second sub-pixel SPX2 may be disposed in the sub-display area.

The first sub-pixel SPX1 may include the first transistor unit TRA1 and the first light emitting element LEL1. The first light emitting element LEL1 may be disposed to overlap the first transistor unit TRA1. In other words, the first light emitting element LEL1 may be disposed on the first transistor unit TRA1.

In the first light emitting element LEL1, the first emission area EMA1 emitting light may be defined by the pixel defining layer PDL to be described later. The first emission area EMA1 may be divided into a first_first emission area EMA1_R, a first_second emission area EMA1_G, and a first_third emission area EMA1_B that emit different colors. In some embodiments, the first_first emission area EMA1_R may emit red light, the first_second emission area EMA1_G may emit green light, and the first_third emission area EMA1_B may emit blue light, but the disclosure is not limited thereto.

Accordingly, the first sub-pixel SPX1 may emit red light, green light, or blue light depending on the color emitted from the first emission area EMA1. In this case, the first sub-pixel SPX1 including the first_first emission area EMA1_R may emit red light, the first sub-pixel SPX1 including the first_second emission area EMA1_G emits green light, and the first sub-pixel SPX1 including the first_third emission area EMA1_B emits blue light.

The plurality of first sub-pixels SPX1 may be disposed adjacent to each other in the main display area MDA and the second sub-display area SDAb. In some embodiments, a structure in which the first sub-pixel SPX1 emitting red light, the first sub-pixel SPX1 emitting green light, and the first sub-pixel SPX1 emitting blue light, and the first sub-pixel SPX1 emitting green light among the plurality of first sub-pixels SPX1 are repeatedly arranged side by side in the second direction DR2 may be provided in the main display area MDA and the second sub-display area SDAb, but the disclosure is not limited thereto.

The second sub-pixel SPX2 may include the second transistor unit TRA2 and the second light emitting element LEL2. The second light emitting element LEL2 may not overlap the second transistor unit TRA2. In other words, the second light emitting element LEL2 may be disposed only in the first sub-display area SDAa, and the second transistor unit TRA2 may be disposed only in the second sub-display area SDAb so that the second light emitting element LEL2 and the second transistor unit TRA2 may not overlap each other. For example, the second light emitting element LEL2 may be disposed in the first sub-display area SDAa. In addition, the first light emitting element LEL1, the transistor unit TRA1, and the second transistor unit TRA2 except the second light emitting element LEL2 may be disposed in the second sub-display area SDAb, and the first light emitting element LEL1 and the first transistor unit TRA1 may be disposed in the main display area MDA. The second light emitting elements LEL2 may be arranged at relatively large intervals compared to the first light emitting elements LEL1. Accordingly, the pixel per inch in the main display area MDA may be relatively higher than the pixel per inch in the first sub-display area SDAa. Meanwhile, the second light emitting element LEL2 and the second transistor unit TRA2 may be electrically connected by a conductive portion 130 (see FIG. 9) of a transparent oxide layer 100 to be described later.

In addition, in the second sub-pixel SPX2, the second emission area EMA2 emitting light may be defined by the pixel defining layer PDL to be described later. The second emission area EMA2 may be divided into a second_first emission area EMA2_R, a second_second emission area EMA2_G, and a second third emission area EMA2_B that emit different colors. In some embodiments, the second_first emission area EMA2_R may emit red light, the second_second emission area EMA2_G may emit green light, and the second_third emission area EMA2_B may emit blue light, but the disclosure is not limited thereto.

Accordingly, the second sub-pixel SPX2 may emit red light, green light, or blue light depending on the color emitted from the first emission area EMA1. In this case, the second sub-pixel SPX2 including the second first emission area EMA2_R may emit red light, the second sub-pixel SPX2 including the second_second emission area EMA2_G may emit green light, and the second sub-pixel SPX2 including the second_third emission area EMA2_B may emit blue light.

The second emission areas EMA2 of the plurality of second sub-pixels SPX2 may be spaced apart from each other with the light transmitting part TPA interposed therebetween in the first sub-display area SDAa. In this case, the first sub-display area SDAa may include the second emission area EMA2 where the second light emitting element LEL2 is disposed and the light transmitting part TPA that is an area other than the second emission area EMA2. In some embodiments, in the first sub-display area SDAa, among the plurality of second sub-pixels SPX2, the second sub-pixel SPX2 emitting red light, the second sub-pixel SPX2 emitting green light, and the second sub-pixel SPX2 emitting blue light may be spaced apart from each other with the light transmitting part TPA interposed therebetween by a width greater than each of the plurality of first sub-pixels SPX1, but the disclosure is not limited thereto. Accordingly, the pixel per inch in the first sub-display area SDAa may be further lower than the pixel per inch in the main display area MDA.

The transparent oxide layer 100 to be described later may be disposed in the entire first sub-display area SDAa. In other words, the first sub-display area SDAa may be completely covered by the transparent oxide layer 100. The transparent oxide layer 100 may include the conductive portion 130 having conductivity and a non-conductive portion 110 having no conductivity in the first sub-display area SDAa. The conductive portion 130 of the transparent oxide layer 100 may serve as a line connecting the second transistor unit TRA2 to the second light emitting element LEL2. The conductive portion 130 of the transparent oxide layer 100, which is a result of plasma treatment of a part of a transparent oxide material layer 100' (see FIGS. 17 and 18) in a manufacturing method to be described later, may be formed in a pattern in the first sub-display area SDAa. In other words, as shown in FIG. 7, the conductive portion 130 of the transparent oxide layer 100 may be a portion in which only a part of the transparent oxide layer 100 that functions as a line area is patterned in the first sub-display area SDAa, and the non-conductive portion 110 may be a portion that is not patterned. Accordingly, the area occupied by the non-conductive portion 110 of the transparent oxide layer 100 may be larger than the area occupied by the conductive portion 130.

Due to the above configuration, the light passing through the first sub-display area SDAa may not have a path difference. A detailed description thereof will be given later. Hereinafter, the stacked structure of the display panel 300 will be described in detail.

Figure 8:
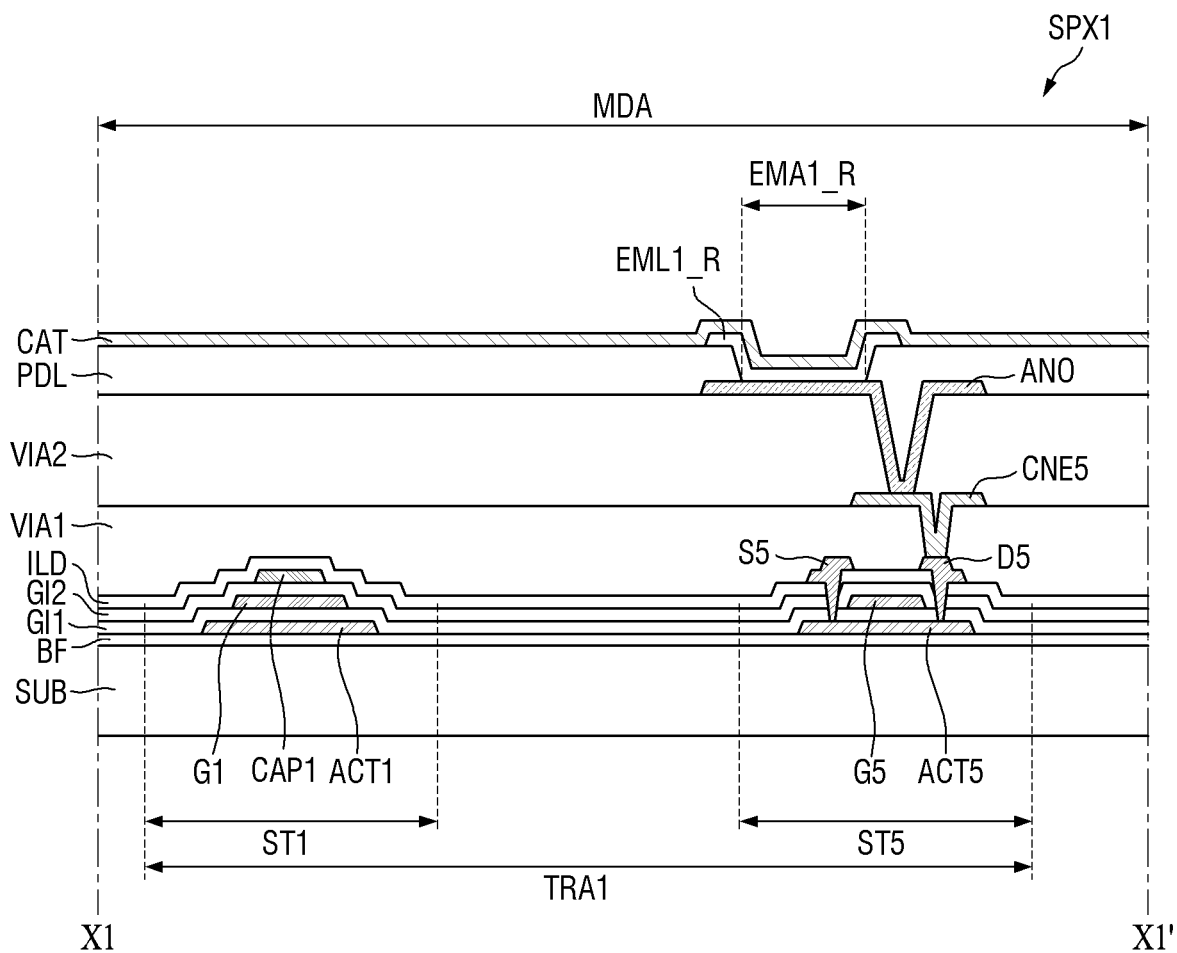
FIG. 8 is a cross-sectional view illustrating a schematic cross section of a first sub-pixel disposed in a main display area.
Figure 9:
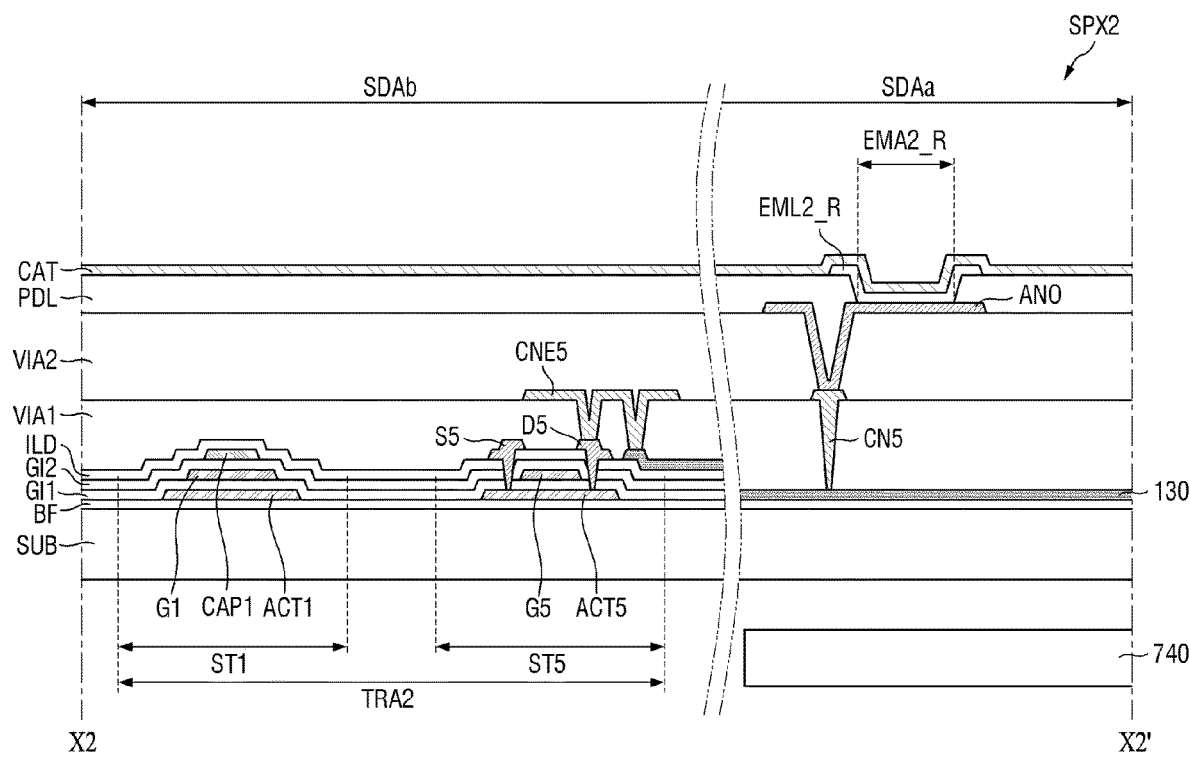
FIG. 9 is a cross-sectional view illustrating a schematic cross section of a second sub-pixel disposed in a sub-display area.
Figure 9:
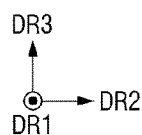
Figure 10:
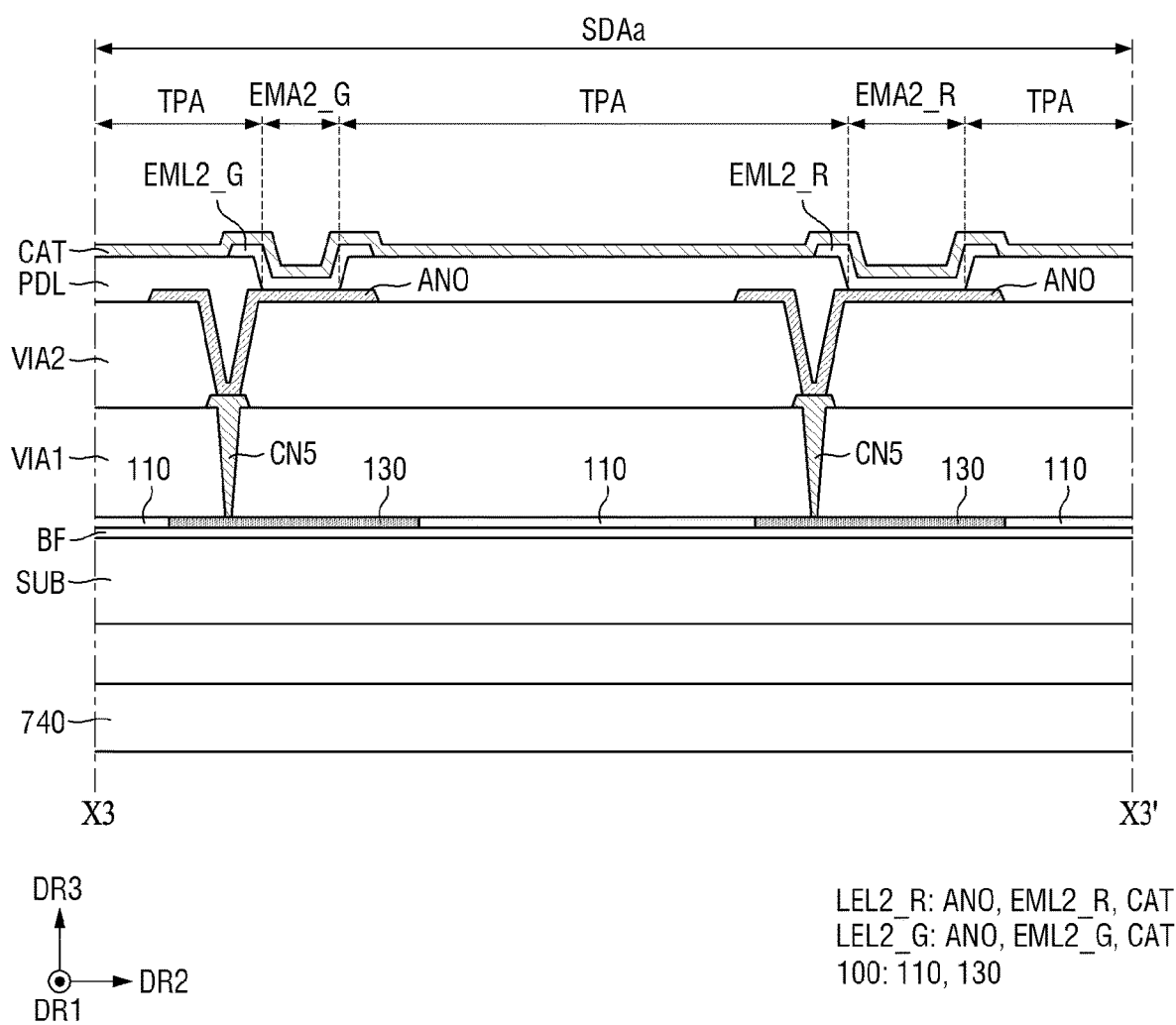
FIG. 10 is a cross-sectional view illustrating a schematic cross section of a second light emitting element disposed in a first sub-display area.
Figure 11:
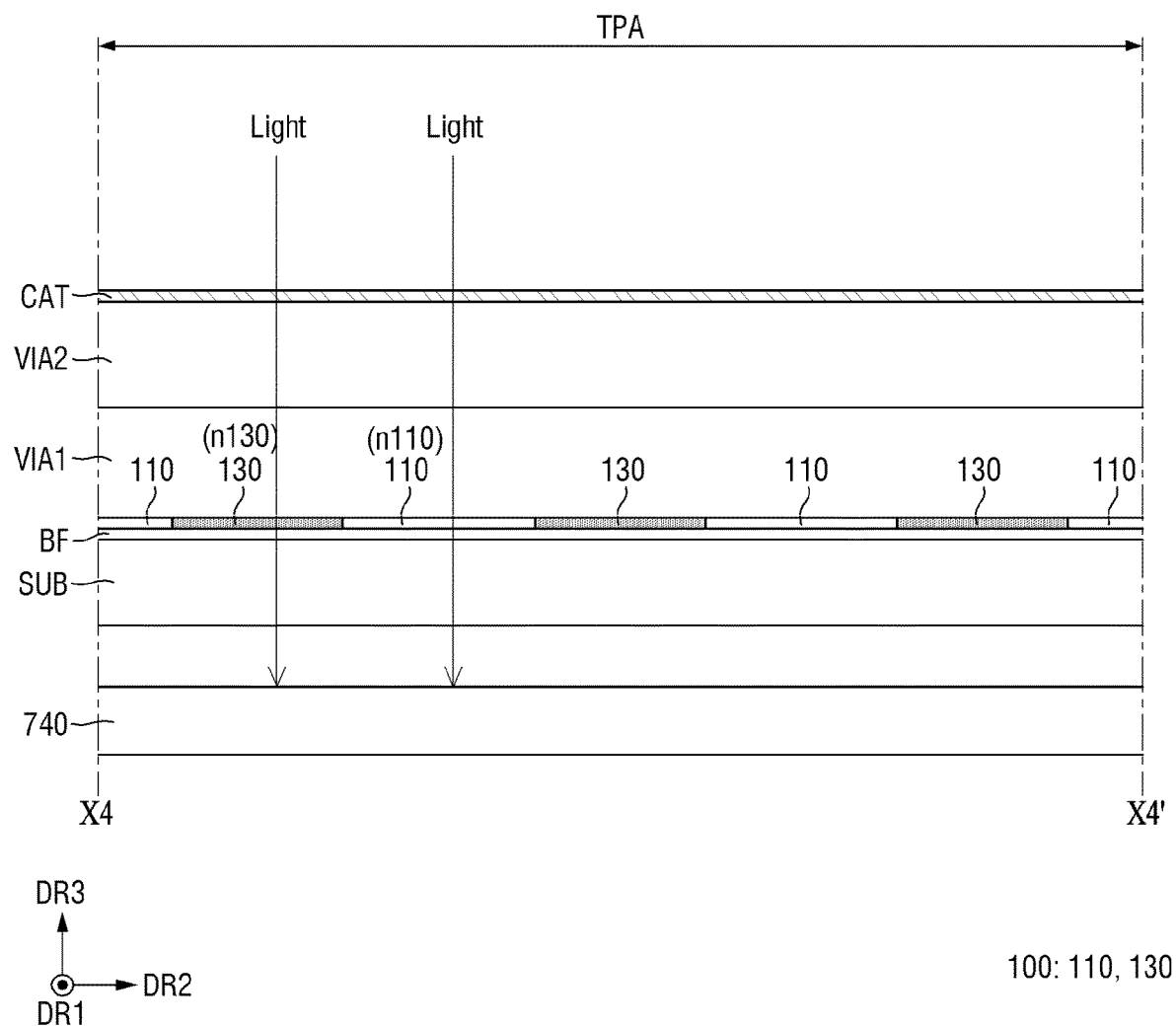
FIG. 11 is a cross-sectional view illustrating a schematic structure of a first sub-display area in a light transmitting area.

FIG. 8 is a cross-sectional view illustrating a schematic cross section of a first sub-pixel disposed in a main display area. FIG. 9 is a cross-sectional view illustrating a schematic cross section of a second sub-pixel disposed in a sub-display area. FIG. 10 is a cross-sectional view illustrating a schematic cross section of a second light emitting element disposed in a first sub-display area. FIG. 11 is a cross-sectional view illustrating a schematic structure of a first sub-display area in a light transmitting area.

Referring to FIG. 8, the display panel 300 according to one embodiment may be a structure in which a substrate SUB, a buffer layer BF, a semiconductor layer ACTL, a first gate insulating layer GI1, a first gate conductive layer GAT1, a second gate insulating layer GI2, a second gate conductive layer GAT2, an interlayer insulating layer ILD, a first metal conductive layer SD1, a first via insulating layer VIA1, a second metal conductive layer SD2, a second via insulating layer VIA2, the pixel defining layer PDL, and the first light emitting element LEL1 are sequentially stacked along the third direction DR3 in the main display area MDA. For simplicity of description, the first thin film transistor ST1 and the fifth thin film transistor ST5 of the first transistor unit TRA1 are illustrated in FIG. 8. Further, FIG. 8 illustrates a schematic cross section taken along line X1-X1' of FIG. 6. In FIG. 8, the first light emitting element LEL1 may be a first_first light emitting element LEL1_R emitting red light, the first light emitting layer EML1 may be a first_first light emitting layer EML1_R emitting red light, and the first emission area EMA1 may be the first_first emission area EMA1_R emitting red light.

Meanwhile, the main display area MDA, the first sub-display area SDAa, and the second sub-display area SDAb of the display panel 300 may be equally applied to each component of the display panel 300 to be described later. For example, a part of the substrate SUB overlapping the main display area MDA of the display panel 300 in the third direction DR3 may be the main display area MDA of the substrate SUB, a part of the substrate SUB overlapping the first sub-display area SDAa of the display panel 300 in the third direction DR3 may be the first sub-display area SDAa of the substrate SUB, and a part of the substrate SUB overlapping the second sub-display area SDAb of the display panel 300 in the third direction DR3 may be the second sub-display area SDAb of the substrate SUB.

The substrate SUB may serve as the base of the display panel 300. When the substrate SUB is a flexible substrate SUB having flexibility, the substrate SUB may include polyimide, but the disclosure is not limited thereto. Further, when the substrate SUB is a rigid substrate SUB having rigidity, the substrate SUB may include glass, but the disclosure is not limited thereto. Hereinafter, for simplicity of description, the case where the substrate SUB is the flexible substrate SUB having flexibility and includes polyimide will be mainly described.

The buffer layer BF may serve to prevent diffusion of metal atoms or impurities from the substrate SUB to the semiconductor layer ACTL. The buffer layer BF may be disposed on the entire substrate SUB. The buffer layer BF may include an inorganic insulating material ($SiO_xN_y$).

In the main display area MDA, the semiconductor layer ACTL may include the semiconductor active regions of the first thin film transistor ST1, the second thin film transistor, the third thin film transistor, the fourth thin film transistor, the fifth thin film transistor ST5, the sixth thin film transistor, and the seventh thin film transistor of the first transistor unit TRA1. For example, as shown in FIG. 8, the first thin film transistor ST1 of a first thin film transistor may include a first semiconductor active region ACT1, and the fifth thin film transistor ST5 thereof may include a fifth semiconductor active region ACT5.

The first semiconductor active region ACT1 may include a first channel region overlapping a first gate electrode G1 to be described later, a first drain region located at one side of the first channel region, and a first source region located at the other side of the first channel region, and the fifth semiconductor active region ACT5 may include a fifth channel region overlapping a fifth gate electrode G5 to be described later, a fifth drain region located at one side of the fifth channel region, and a fifth source region located at the other side of the fifth channel region.

The semiconductor layer ACTL may be positioned directly on one surface of the buffer layer BF. That is, the semiconductor layer ACTL may be in direct contact with one surface of the buffer layer BF. The semiconductor layer ACTL may be selectively patterned and disposed on the buffer layer BF. In some embodiments, the semiconductor layer ACTL may include polycrystalline silicon, but the disclosure is not limited thereto. For example, the semiconductor layer ACTL may include amorphous silicon, an oxide semiconductor, or the like.

The first gate insulating layer GI1 may serve to insulate the semiconductor layer ACTL from the first metal conductive layer SD1 to be described later. The first gate insulating layer GI1 may be disposed on the buffer layer BF on which the semiconductor layer ACTL is disposed to cover the semiconductor layer ACTL. The first gate insulating layer GI1 may be disposed along the profile of the semiconductor layer ACTL. In some embodiments, the first gate insulating layer GI1 may include an inorganic insulating material ($SiO_xN_y$).

The first metal conductive layer SD1 may be disposed on the first gate insulating layer GI. The first metal conductive layer SD1 may be positioned directly on one surface of the first gate insulating layer GI1. That is, the first metal conductive layer SD1 may be in direct contact with one surface of the first gate insulating layer GI1.

The first gate conductive layer GAT1 may include gate electrodes of the first thin film transistor ST1, the second thin film transistor, the third thin film transistor, the fourth thin film transistor, the fifth thin film transistor ST5, the sixth thin film transistor, and the seventh thin film transistor of the first transistor unit TRA1 disposed in the main display area MDA. For example, as shown in FIG. 8, the first gate conductive layer GAT1 may include the first gate electrode G1 of the first thin film transistor ST1 and the fifth gate electrode G5 of the fifth thin film transistor ST5. As described above, the first gate electrode G1 and the fifth gate electrode G5 may overlap the first channel region of the first semiconductor active region ACT1 and the fifth channel region of the fifth semiconductor active region ACT5 in the third direction DR3, respectively.

The first gate conductive layer GAT1 may include a metal. For example, the first gate conductive layer GAT1 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second gate insulating layer GI2 may insulate the first gate conductive layer GAT1 from the second gate conductive layer GAT2 to be described later. The second gate insulating layer GI2 may be disposed on the first gate insulating layer GI1 on which the first gate conductive layer GAT1 is disposed to cover the first gate conductive layer GAT1. The second gate insulating layer GI2 may be disposed to have substantially the same thickness along the profile of the first gate conductive layer GAT1. In some embodiments, the second gate insulating layer GI2 may include an inorganic insulating material ($SiO_xN_y$).

The second gate conductive layer GAT2 may be disposed on the second gate insulating layer GI2. The second gate conductive layer GAT2 may be positioned directly on one surface of the second gate insulating layer GI2. That is, the second gate conductive layer GAT2 may be in direct contact with one surface of the second gate insulating layer GI2.

The second gate conductive layer GAT2 may include a first capacitor electrode disposed in the display area DA. For example, as shown in FIG. 8, the second gate conductive layer GAT2 may include a first capacitor electrode CAP1 of the first thin film transistor. The same voltage as that applied to the first driving voltage line VDDL (see FIG. 5) may be applied to the first capacitor electrode CAP1. The first capacitor electrode CAP1 may form a capacitor Cap (see FIG. 5) together with the first gate electrode G1 and the second gate insulating layer GI2. The first capacitor electrode CAP1 may overlap the first gate electrode G1 in the third direction DR3.

The second gate conductive layer GAT2 may include a metal. For example, the second gate conductive layer GAT2 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The interlayer insulating layer ILD may insulate the second gate conductive layer GAT2 from the first metal conductive layer SD1 to be described later. The interlayer insulating layer ILD may be disposed on the second gate insulating layer GI2 on which the second gate conductive layer GAT2 is formed. The interlayer insulating layer ILD may include an inorganic insulating material ($SiO_xN_y$).

The first metal conductive layer SD1 may be disposed on the interlayer insulating layer ILD. The first metal conductive layer SD1 may include source electrodes and drain electrodes of the first thin film transistor ST1, the second thin film transistor, the third thin film transistor, the fourth thin film transistor, the fifth thin film transistor ST5, the sixth thin film transistor, and the seventh thin film transistor of the first transistor unit TRA1. For example, the first metal conductive layer SD1 may include a fifth source electrode S5 and a fifth drain electrode D5 of the fifth thin film transistor as shown in FIG. 8.

When the first metal conductive layer SD1 is disposed and the source electrode and the drain electrode are formed on the interlayer insulating layer ILD, the first thin film transistor ST1, the second thin film transistor, the third thin film transistor, the fourth thin film transistor, the fifth thin film transistor ST5, the sixth thin film transistor, and the seventh thin film transistor of the first transistor unit TRA1 may be defined. The fifth source electrode S5 and the fifth drain electrode D5 may be electrically connected to the fifth source/drain regions of a fifth semiconductor pattern, respectively, through contact holes formed through the first interlayer insulating layer ILD, the second gate insulating layer GI2, and the first gate insulating layer GI1.

The first metal conductive layer SD1 may include a metal. For example, the first metal conductive layer SD1 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). In some embodiments, the first metal conductive layer SD1 may have a multilayer structure. For example, the first metal conductive layer SD1 may have a two-layer structure of Ti/Al or a three-layer structure of Ti/Al/Ti.

The first via insulating layer VIA1 may serve to partially insulate the first metal conductive layer SD1 from the second metal conductive layer SD2 to be described later, and flatten a stepped portion formed by the element of the first transistor unit TRA1. The first via insulating layer VIA1 may be disposed on the interlayer insulating layer ILD on which the first metal conductive layer SD1 is formed. The first via insulating layer VIA1 may be made of an organic insulating material such as an acrylic resin, a polyimide-based resin, a polyamide-based resin, or the like.

The second metal conductive layer SD2 may be disposed on the first via insulating layer VIA1. The second metal conductive layer SD2 may include a connection electrode, an initialization voltage line, or the like electrically connected to the source electrodes or the drain electrodes of the first thin film transistor ST1, the second thin film transistor, the third thin film transistor, the fourth thin film transistor, the fifth thin film transistor ST5, the sixth thin film transistor, and the seventh thin film transistor of the first transistor unit TRA1. For example, the second metal conductive layer SD2 may include a fifth connection electrode CNE5 electrically connected to the fifth drain electrode D5 as shown in FIG. 8. The fifth connection electrode CNE5 may be electrically connected to the fifth drain electrode D5 through a contact hole penetrating the first via insulating layer VIA1.

The second metal conductive layer SD2 may include a metal. For example, the second metal conductive layer SD2 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). In some embodiments, the second metal conductive layer SD2 may have a multilayer structure. For example, the second metal conductive layer SD2 may have a two-layer structure of Ti/Al or a three-layer structure of Ti/Al/Ti.

The second via insulating layer VIA2 may be disposed on the first via insulating layer VIA1 on which the second metal conductive layer SD2 is formed in the main display area MDA. The second via insulating layer VIA2 may be made of an organic insulating material such as an acrylic resin, a polyimide-based resin, a polyamide-based resin, or the like. One surface of the second via insulating layer VIA2 in the third direction DR3 may be the top surface on which the pixel defining layer PDL is disposed, and the other surface of the second via insulating layer VIA2 in the third direction DR3 may be the bottom surface on which the first via insulating layer VIA1 is disposed.

The first light emitting element LEL1 may include an anode electrode ANO, the first light emitting layer EML1, and a cathode electrode CAT, and may be disposed on the second via insulating layer VIA2.

The anode electrode ANO of the first light emitting element LEL1 may be electrically connected to the fifth connection electrode CNE5 through a contact hole penetrating the second via insulating layer VIA2, and then may be electrically connected to the fifth drain electrode D5 of the thin film transistor ST5 as shown in FIG. 8.

The pixel defining layer PDL may be disposed on the second via insulating layer VIA2 on which the anode electrode ANO is disposed. The pixel defining layer PDL may be made of an organic material such as an acrylic resin, a polyimide resin, or the like. The pixel defining layer PDL may form an opening partially exposing the anode electrode. The first emission area EMA1 of the first light emitting layer EML1 may be defined by the opening.

The first light emitting layer EML1 may be disposed on the anode electrode ANO and the pixel defining layer PDL. When the first light emitting layer EML1 is an organic light emitting layer including an organic material, the first light emitting element LEL1 may be an organic light emitting diode, when the first light emitting layer EML1 includes a quantum dot light emitting layer, the first light emitting element LEL1 may be a quantum dot light emitting element, and when the first light emitting layer EML1 includes an inorganic semiconductor, the first light emitting element LEL1 may be an inorganic light emitting element. Alternatively, the first light emitting element LEL1 may be a micro light emitting diode.

The cathode electrode CAT may be disposed on the first light emitting layer EML1. The cathode electrode CAT may cover the entire pixel defining layer PDL on which the first light emitting layer EML1 is formed. In other words, the cathode electrode CAT may be formed to have substantially the same thickness along the profile of the pixel defining layer PDL on which the first emission layer EML1 is formed.

A thin film encapsulation layer may be further disposed on the first light emitting element LEL1. The thin film encapsulation layer may serve to prevent external moisture and oxygen from permeating the first light emitting element LEL1.

A touch sensor layer may be further disposed on the thin film encapsulation layer. The touch sensor layer may serve to sense a touch input applied to the display device 1. The touch sensor layer may have a structure in which a conductive layer and an insulating layer are sequentially stacked. The conductive layer of the touch sensor layer may have a mesh-type shape in a plan view.

Hereinafter, the structure of the display panel 300 in the sub-display area SDA will be described in detail.

Referring to FIGS. 9 and 10, the second sub-pixel SPX2 may be disposed in the sub-display area SDA. Specifically, the second sub-pixel SPX2 may include the second light emitting element LEL2 and the second transistor unit TRA2, the second light emitting element LEL2 may be disposed only in the first sub-display area SDAa, the second transistor unit TRA2 may be disposed only in the second sub-display area SDAb, and the second transistor unit TRA2 and the second light emitting element LEL2 may be electrically connected by the conductive portion 130 of the transparent oxide layer 100 to be described later. In other words, the second light emitting element LEL2 of the second sub-pixel SPX2 may overlap the first sub-display area SDAa and may not overlap the second sub-display area SDAb and the main display area MDA, and the second transistor unit TRA2 of the second sub-pixel SPX2 may overlap the second sub-display area SDAb and may not overlap the first sub-display area SDAa and the main display area MDA. In other words, the second transistor unit TRA2 and the second light emitting element LEL2 may not overlap in the third direction DR3.

The second sub-display area SDAb may include a first area in which the first sub-pixel SPX1 is disposed and a second area in which the second transistor unit TRA2 is disposed. The region of the second sub-display area SDAb where the first sub-pixel SPX1 is disposed, i.e., the first region (see FIG. 7) has the same structure as the structure of the display panel 300 in the above-described main display region MDA so that the description thereof will be omitted. In some embodiments, the second regions may be disposed at the other end of the first region in the first direction DR1 and arranged side by side in the second direction DR2, but the disclosure is not limited thereto. For example, the second regions may be disposed at one end of the first region in the second direction DR2 and arranged side by side in the first direction DR1.

In the region of the second sub-display area SDAb where the second transistor unit TRA2 of the second sub-pixel SPX2 is disposed, as shown in FIG. 9, a structure in which the substrate SUB, the buffer layer BF, the semiconductor layer ACTL, the first gate insulating layer GI1, the first gate conductive layer GAT1, the second gate insulating layer GI2, the second gate conductive layer GAT2, the interlayer insulating layer ILD, the first metal conductive layer SD1, the transparent oxide layer 100, the first via insulating layer VIA1, the second metal conductive layer SD2, the second via insulating layer VIA2, the pixel defining layer PDL, and the cathode electrode CAT are sequentially stacked along the third direction DR3 may be provided, and the other configurations may be substantially the same as the structure in the main display area MDA. FIG. 9 schematically illustrates a cross section taken along line X2-X2' of FIG. 7, and the second light emitting element LEL2 disposed in the first sub-area may be a second_first light emitting element LEL2_R emitting red light, the second light emitting layer EML2 may be a second_first light emitting layer emitting red light, and the second emission area EMA2 may be a second_first emission area EMA2_R emitting red light. For simplicity of description, only the first transistor ST1 and the fifth transistor ST5 of the second transistor unit TRA2 are illustrated in FIG. 9.

Since the structures of the first thin film transistor and the second thin film transistor are substantially the same, the detailed description thereof will be omitted.

The transparent oxide layer 100 may be additionally disposed on the interlayer insulating layer ILD near the boundary between the second sub-display area SDAb and the first sub-display area SDAa. The transparent oxide layer 100 may serve to electrically connect the second transistor unit TRA2 to the second light emitting element LEL2. The transparent oxide layer 100 may include a material that is transparent in a visible light region, such as indium tin oxide (ITO), indium zinc oxide (IZO), indium gallium zinc oxide (IGZO), or the like.

The transparent oxide layer 100 may include the conductive portion 130 having conductivity and the non-conductive portion 110 having no conductivity. As described above, the conductive portion 130 may be a patterned result of plasma treatment of a part of the transparent oxide layer 100. As illustrated in FIGS. 9 and 10, the second transistor unit TRA2 and the second light emitting element LEL2 may be electrically connected by the conductive portion 130 of the transparent oxide layer 100. The conductive portion 130 may be electrically connected to the fifth connection electrode CNE5 through the contact hole penetrating the first via insulating layer VIA1. The fifth connection electrode CNE5 may be electrically connected to the fifth drain electrode D5 through another contact hole penetrating the first via insulating layer VIA1. Accordingly, the conductive portion 130 may be electrically connected to the fifth drain electrode by the fifth connection electrode CNE5.

Since the first light emitting element LEL1 and the second light emitting element LEL2 are not disposed in the region of the second sub-display area SDAb where the second transistor unit TRA2 of the second sub-pixel SPX2 is disposed, the pixel defining layer PDL may be directly disposed on the second via insulating layer VIA2 without a separate device disposed thereon.

In the first sub-display area SDAa, the structure in which the semiconductor layer ACTL, the first gate insulating layer GI1, the first gate conductive layer GAT1, the second gate insulating layer GI2, the second gate conductive layer GAT2, and the interlayer insulating layer ILD are omitted may be provided, but the disclosure is not limited thereto. This may be the result of the case where the first transistor unit TRA1 or the second transistor unit TRA2 is not disposed in the first sub-display area SDAa, and the first gate insulating layer GI1, the second gate insulating layer GI2, and the interlayer insulating layer ILD formed in the first sub-display area SDAa are subjected to dry etching in the manufacturing process of the display device 1 to be described later. Accordingly, in the first sub-display area SDAa, the structure in which the substrate SUB, the buffer layer BF, the transparent oxide layer 100 disposed on the buffer layer BF and in direct contact with one surface of the buffer layer BF, the fifth connection node CN5, the first via insulating layer VIA1, the second via insulating layer VIA2, and the second light emitting element LEL2 are disposed may be provided.

In the first sub-display area SDAa, the second gate conductive layer GAT2 may further include the fifth connection node CN5. The fifth connection node CN5 serves to electrically connect the conductive portion 130 of the transparent oxide layer 100 to the anode electrode of the second light emitting element LEL2 disposed on the second via insulating layer VIA2. Specifically, the fifth connection node CN5 may be disposed on the first via insulating layer VIA1 and electrically connect the conductive portion 130 of the transparent oxide layer 100 to the anode electrode of the second light emitting element LEL2 through the contact hole penetrating the first via insulating layer VIA1

The first via insulating layer VIA1 may extend to the first sub-display area SDAa and the second sub-display area SDAb. In this case, the first via insulating layer VIA1 may compensate a relative stepped portion with the second sub-display area SDAb that is generated because the semiconductor layer ACTL, the first gate insulating layer GI1, the first gate conductive layer GAT1, the second gate insulating layer GI2, the second gate conductive layer GAT2, and the interlayer insulating layer ILD are omitted in the first sub-display area SDAa. In other words, the width (hereinafter, referred to as 'thickness') of the first via insulating layer VIA1 in the third direction DR3 may be greater in the first sub-display area SDAa than in the second sub-display area SDAb.

In the first sub-display area SDAa, the second emission areas EMA2 of the second light emitting element LEL2 may be spaced apart from each other with the light transmitting part TPA therebetween. FIG. 10 schematically shows a cross section taken along line X3-X3' of FIG. 7. As shown in FIG. 10, a second_second light emitting element LEL2_G emitting green light and a second_first light emitting element LEL2_R emitting red light may be spaced apart from each other in the second direction DR2. Specifically, the second_second light emitting element LEL2_G may include a second_second light emitting layer emitting green light. The second_second light emitting layer may form the second_second emission area EMA2_G defined by the opening of the pixel defining layer PDL. The second_first light emitting element LEL2_R may include the second_first light emitting layer emitting red light. The second_first light emitting layer may form the second_first emission area EMA2_R defined by the opening of the pixel defining layer PDL. The second_second emission area EMA2_G and the second_first emission area EMA2_R may be spaced apart from each other in the second direction DR2. Accordingly, in the first sub-display area SDAa, the first transistor unit TRA1 and the second transistor unit TRA2 are not disposed under the second light emitting element LEL2, and the second emission areas EMA2 of the second light emitting element LEL2 are spaced apart from each other. That is, external light may reach the optical device 740 disposed under the substrate SUB through the light transmitting part TPA that is the space where the second emission areas EMA2 are spaced apart from each other. When the external light transmits the light transmitting part TPA, the path of the external light may be different due to the refractive indices of elements disposed in the light transmitting part TPA so that it is necessary to make the refractive index of the light transmitting part TPA uniform by integrating the stacked structure of the light transmitting part TPA.

Referring to FIG. 11, the light transmitting part TPA of the first sub-display area SDAa may have the same stacked structure. This may be due to a configuration in which the transparent oxide layer 100 is disposed in the entire first sub-display area SDAa and only a part of the transparent oxide layer 100 serving as a line is patterned as the conductive portion 130. Specifically, the conductive portion 130 and the non-conductive portion 110 may include the same material while being integrally formed as a part of the transparent oxide layer 100, and may have the same thickness and the same refractive index n130 and n110. Accordingly, in the light transmitting part TPA of the first sub-display area SDAa, the display panel 300 has the same stacked structure regardless of portions, and, thus, the light transmitting the first sub-display area SDAa has no path difference. Hence, a diffraction phenomenon may be prevented, and the image sensed by the optical device 740 may become clearer.

In other words, in the first sub-display area SDAa, the other surface (hereinafter, referred to as 'bottom surface') of the conductive portion 130 of the transparent oxide layer 100 in the third direction DR3 and the other surface (hereinafter referred to as 'bottom surface') of the non-conductive portion 110 in the third direction DR3 may be in direct contact with one surface of the buffer layer BF, and one surface (hereinafter referred to as 'top surface') of the non-conductive portion 110 in the third direction DR3 and one surface (hereinafter, referred to as 'top surface') of the conductive portion 130 in the third direction DR3 may be in direct contact with the first via insulating layer VIA1.

Further, the conductive portion 130 and the non-conductive portion 110 may be in direct contact with each other, may be made of the same material, and may have the same thickness. Accordingly, the bottom surface of the conductive portion 130 and the bottom surface of the non-conductive portion 110 may be located on at least one plane defined by the first direction DR1 and the second direction DR2, the top surface of the conductive portion 130 and the top surface of the non-conductive portion 110 may be located on at least one plane defined by the first direction DR1 and the second direction DR2, and the conductive portion 130 and the non-conductive portion 110 may have the same refractive index n110 and n130.

Further, the conductive portion 130 and the non-conductive portion 110 may be repeatedly disposed in the first sub-display area SDAa to completely cover the first sub-display area SDAa. That is, there is no space between the conductive portion 130 and the non-conductive portion 110 in the first sub-display area SDAa, and the other surface of the first via insulating layer VIA1 in the third direction DR3 and one surface of the buffer layer BF in the third direction DR3 may be completely covered.

Due to the above configuration, the light transmitting the first sub-display area SDAa has no path difference, so that a diffraction phenomenon may be prevented and the image sensed by the optical device 740 may become clearer.

If the space is disposed between the conductive portion 130 and the non-conductive portion 110, the buffer layer BF and the first via insulating layer VIA1 may be in direct contact with each other in the space. Accordingly, the light passing through the conductive portion 130 and the non-conductive portion 110 and the light passing through the space have different paths. That is, a light diffraction phenomenon may occur, and the image sensed by the optical device 740 may be blurred.

Hereinafter, a method of manufacturing the display device 1 according to one embodiment will be described in detail.

Figure 12:
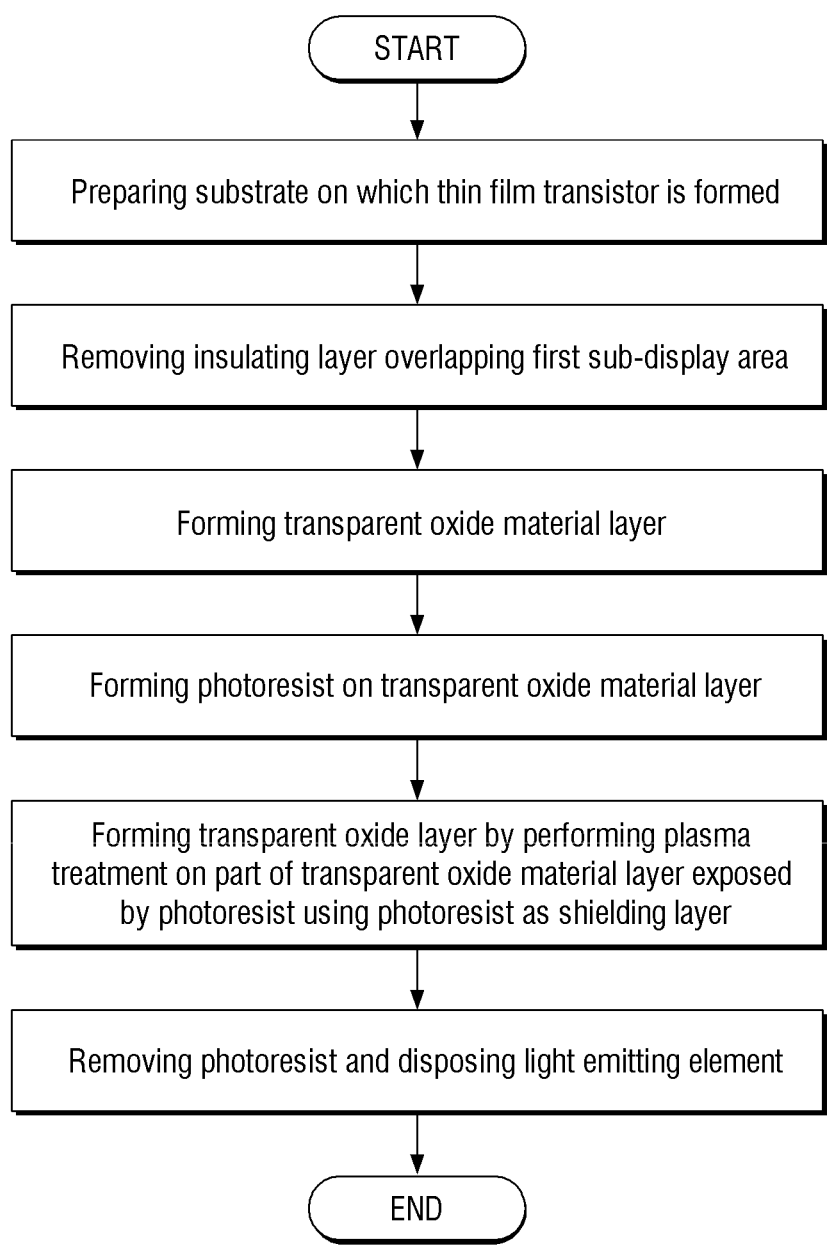
FIG. 12 is a flowchart illustrating a method of manufacturing the display device according to the embodiment of FIG. 1.

FIG. 12 is a flowchart illustrating a method of manufacturing the display device according to the embodiment of FIG. 1. FIGS. 13, 14, 15, 16, 17, and 18 are cross-sectional views showing the steps of a method of manufacturing the display device according to the embodiment of FIG. 1.

Referring to FIG. 12, the method of manufacturing the display device 1 according to the embodiment may include steps of 1) preparing the substrate on which a thin film transistor is formed, 2) removing an insulating layer overlapping the first sub-display area, 3) forming the transparent oxide material layer, 4) forming a photoresist on the transparent oxide material layer, 5) forming the transparent oxide layer by performing plasma treatment on a part of the transparent oxide material layer exposed by the photoresist using the photoresist as a shielding layer, and 6) removing the photoresist and disposing the light emitting element. The method of manufacturing the display device 1 according to one embodiment will be sequentially described in conjunction with FIGS. 13, 14, 15, 16, 17, and 18.

Figure 13:
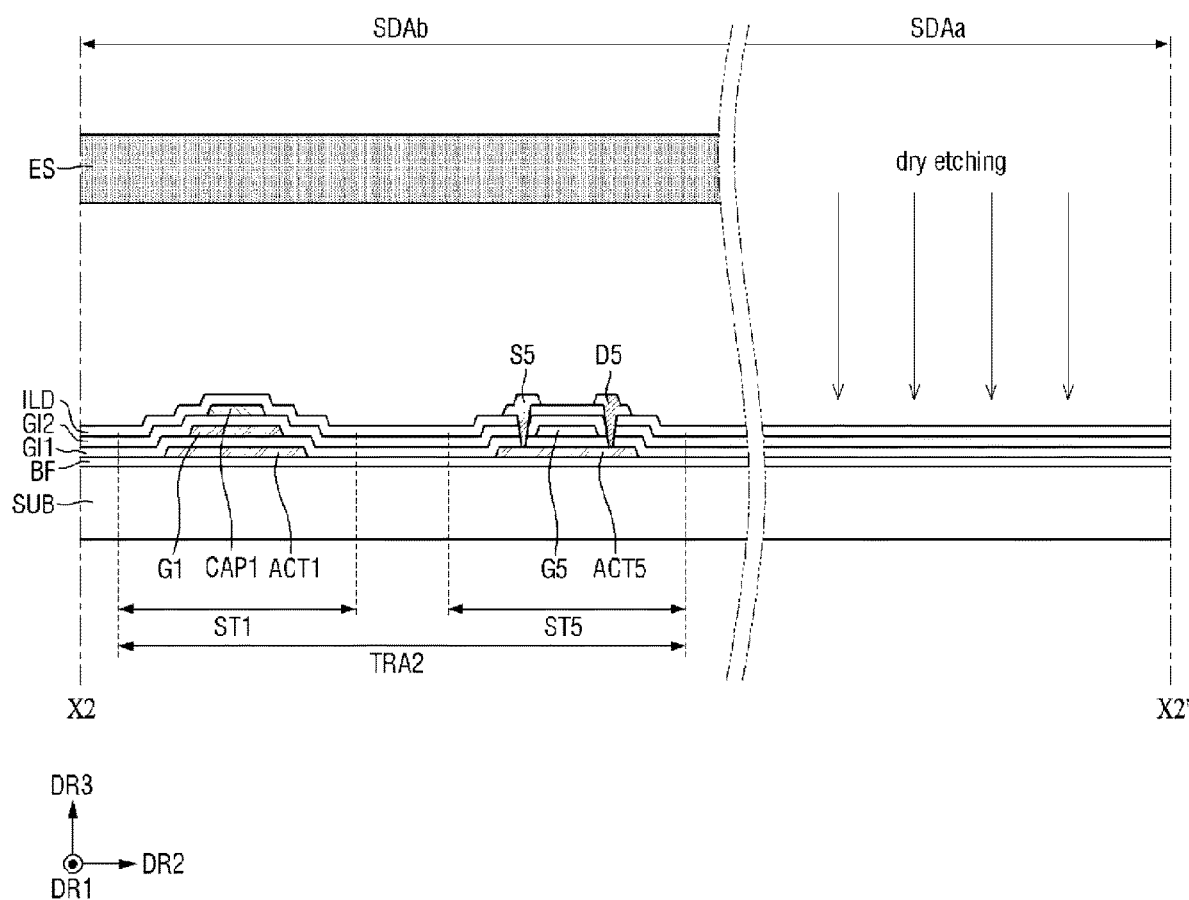
FIGS. 13, 14, 15, 16, 17, and 18 are cross-sectional views showing the steps of a method of manufacturing the display device according to the embodiment of FIG. 1.
Figure 14:
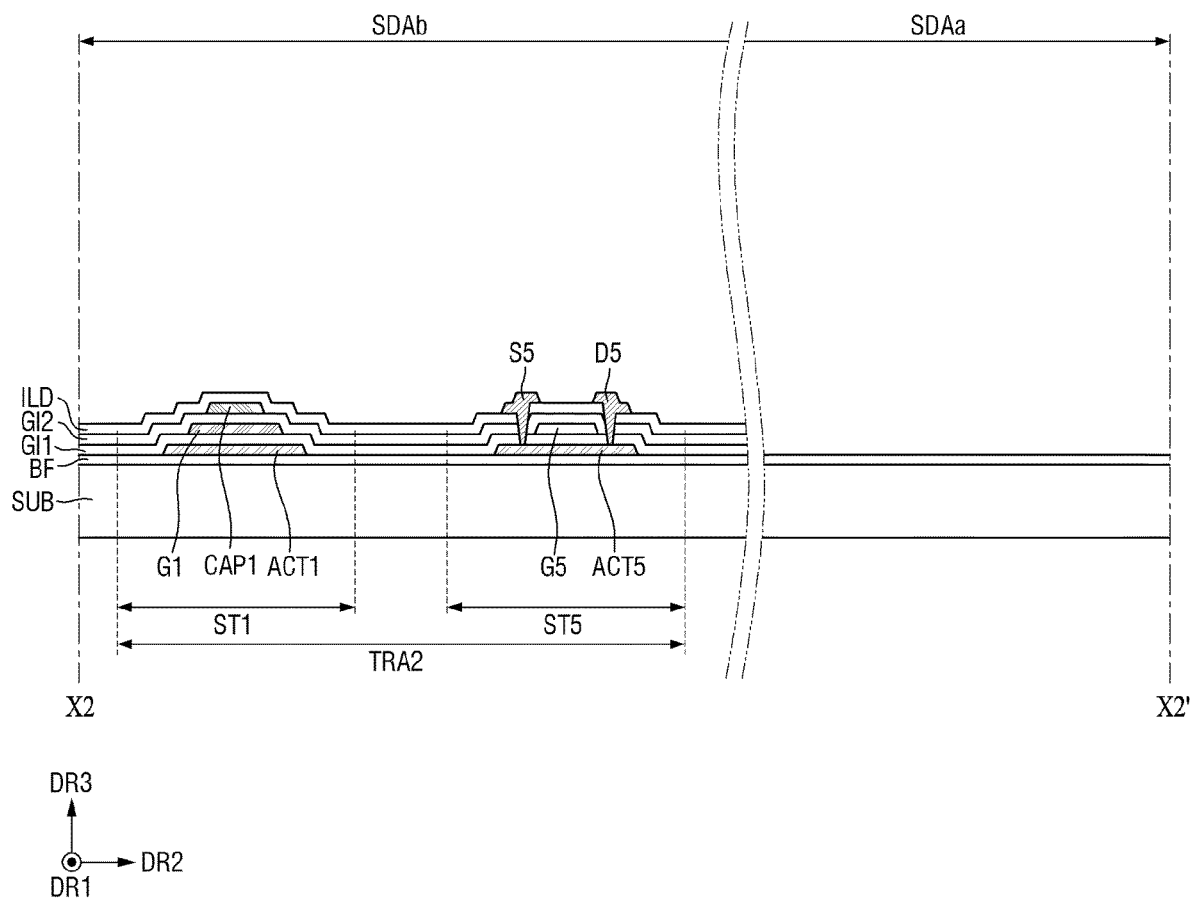

Referring to FIGS. 13 and 14, in the method of manufacturing the display device 1 according to one embodiment, first, a thin film transistor is formed in the second sub-display area SDAb of the substrate SUB, and the first gate insulating layer GI1, the second gate insulating layer GI2, and the interlayer insulating layer ILD disposed in the first sub-display area SDAa of the substrate SUB are etched. Since the method of forming the thin film transistor on the substrate SUB is well known to those skilled in the art, the description thereof will be omitted.

The process of etching the first gate insulating layer GI1, the second gate insulating layer GI2, and the interlayer insulating layer ILD in the first sub-display area SDAa may be performed by, e.g., a dry etching process. In this case, an etching stop layer ES is disposed in the second sub-display area SDAb where etching is not performed, so that the first gate insulating layer GI1, the second gate insulating layer GI2, and the interlayer insulating layer ILD disposed on the second sub-display area SDAb may not be etched. Accordingly, the substrate SUB, the buffer layer BF, the first gate insulating layer GI1, the second gate insulating layer GI2, and the interlayer insulating layer ILD may be disposed in the second sub-display area SDAb, and only the substrate SUB and the buffer layer BF may be disposed in the first sub-display area SDAa. Accordingly, the light transmittance may be further improved in the first sub-display area SDAa.

Figure 15:
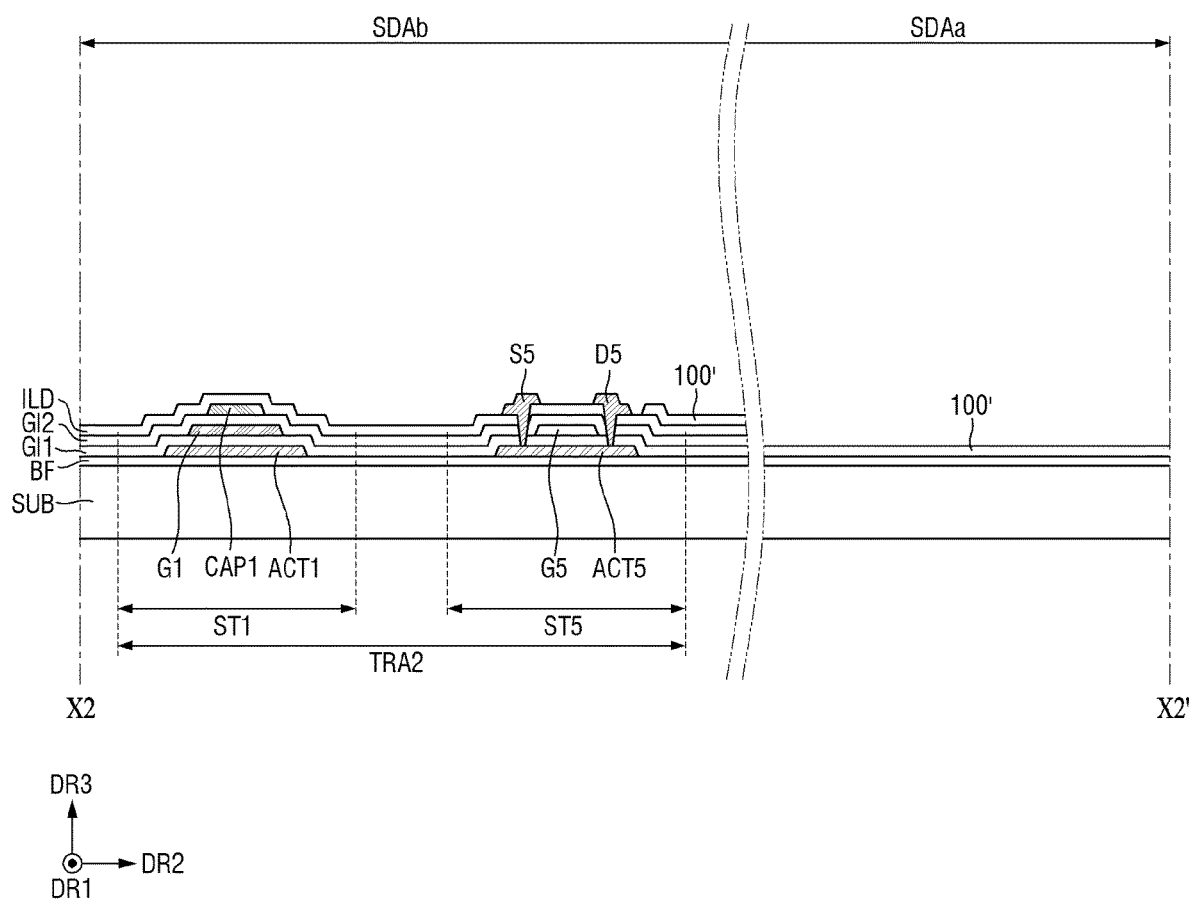
Figure 16:
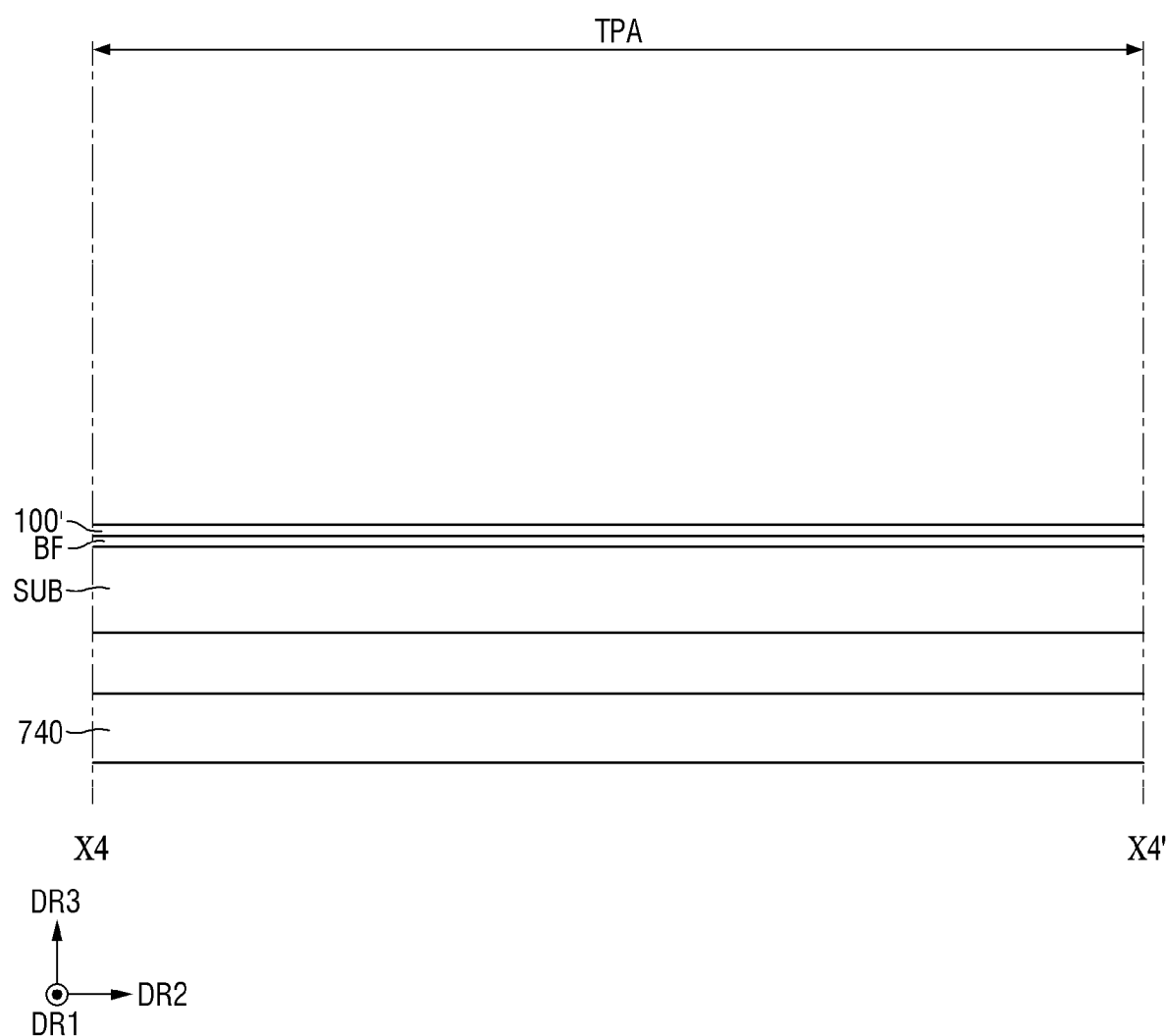

Next, referring to FIGS. 15 and 16, the transparent oxide material layer 100' is formed near the first sub-display area SDAa and the boundary between the first sub-display area SDAa and the second sub-display area SDAb. The process of forming the transparent oxide material layer 100' may be performed by, e.g., a sputtering process.

The transparent oxide material layer 100' may be formed near the boundary between the second sub-display area SDAb and the first sub-display area SDAa and in the entire first sub-display area SDAa. In some embodiments, the transparent oxide layer 100 may be formed on the interlayer insulating layer ILD while being spaced apart from the fifth drain electrode D5 of the fifth thin film transistor of the second transistor unit TRA2 in the second sub-display area SDAb as shown in FIG. 15, and may be formed on the buffer layer BF in the first sub-display area SDAa as shown in FIG. 16, but the disclosure is not limited thereto. In some embodiments, the transparent oxide material layer 100' may include indium tin oxide (ITO), indium zinc oxide (IZO), indium gallium zinc oxide (IGZO), or the like, but the disclosure is not limited thereto. Hereinafter, for simplicity of description, the case where the transparent oxide material layer 100' includes indium gallium zinc oxide will be mainly described. When the transparent oxide material layer 100' includes indium gallium zinc oxide, the generation of impurities during the sputtering process is relatively small and, thus, element reliability may be improved.

The transparent oxide material layer 100' may be formed by the sputtering process in an atmosphere of an oxygen ($O_2$) partial pressure of 50% or more. When the transparent oxide material layer 100' is formed by the sputtering process in an atmosphere of an oxygen ($O_2$) partial pressure of 50% or more, the formed transparent oxide material layer 100' may have non-conductivity.

Figure 17:
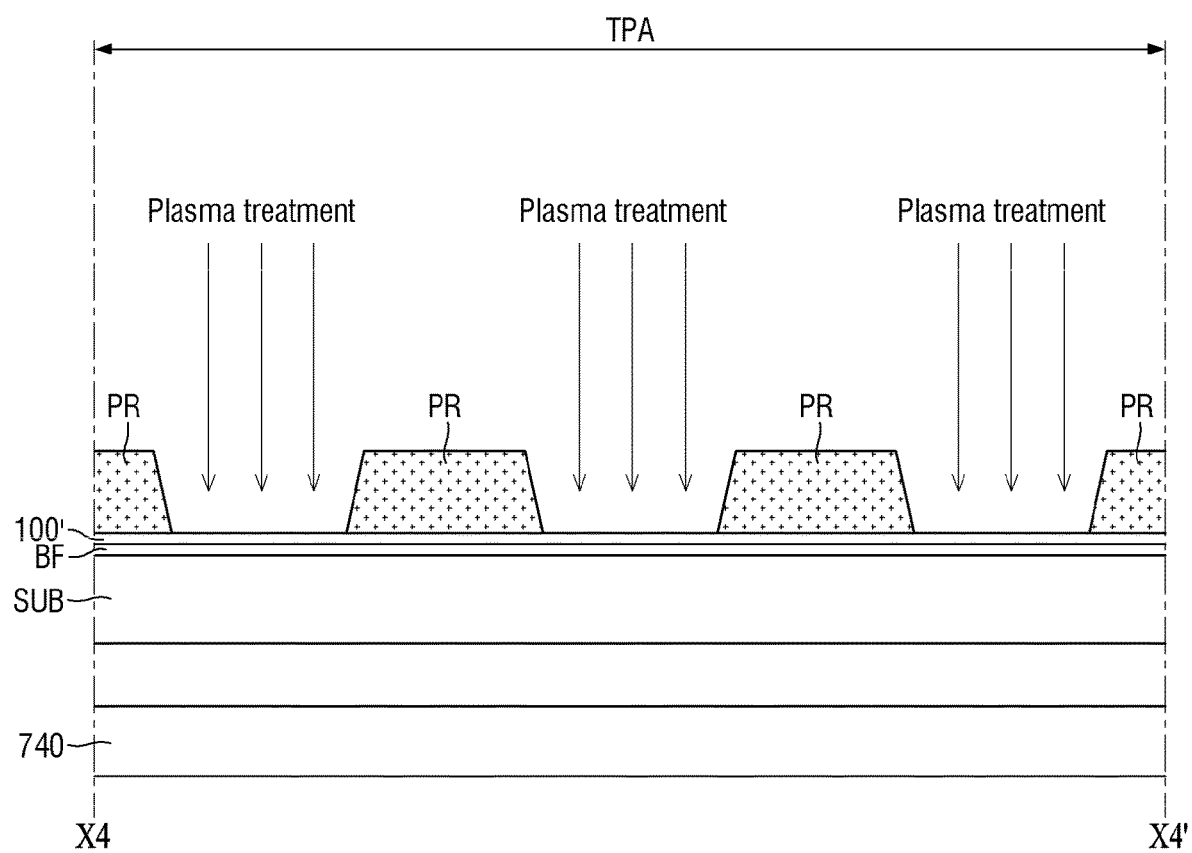
Figure 18:
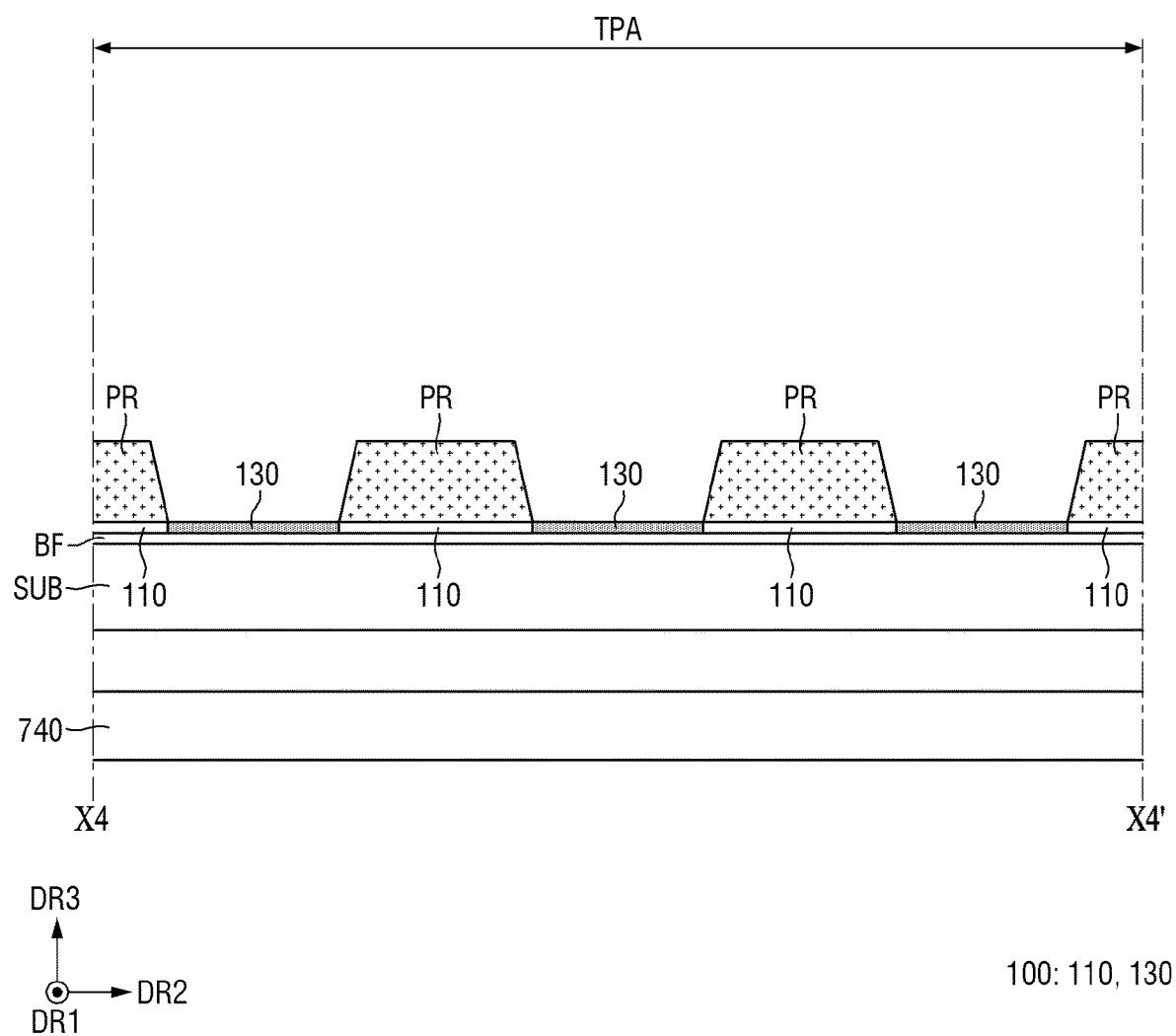

Then, referring to FIGS. 17 and 18, the photoresist PR is formed on the transparent oxide material layer 100', and plasma treatment is performed to form the transparent oxide layer 100. For example, the process of forming the photoresist PR on the transparent oxide material layer 100' may be executed by applying a photosensitive organic material on the transparent oxide material layer 100' and performing exposure and development, and the process of forming the transparent oxide layer 100 by the plasma treatment may be executed by performing the plasma treatment using a fluorine-based gas on the transparent oxide layer 100 exposed by the photoresist PR while using the photoresist PR as a shielding layer.

The plasma treatment may be performed using a fluorine-based gas. In some embodiments, the plasma treatment may use a fluorine-based gas such as $CF_4$, $CHF_3$, and $C_4F_8$, but the disclosure is not limited thereto. As described above, the plasma treatment may be performed only on a portion of the transparent oxide layer 100 disposed in the first sub-display area SDAa that serves as a line. Accordingly, the conductive portion 130 of the transparent oxide layer 100 may be patterned.

When the plasma treatment is performed on the transparent oxide material layer 100', the uniformity of a part of the transparent oxide material layer 100' that is subjected to the plasma treatment may be higher than the uniformity of other parts of the transparent oxide material layer 100' that are covered by the photoresist PR and not subjected to the plasma treatment. The high uniformity may mean that molecules of a material are arranged with a relatively high order. There may be a correlation that the conductivity increases as the uniformity becomes higher. Accordingly, the portion of the transparent oxide material layer 100' that is subjected to the plasma treatment may become the conductive portion 130 having conductivity, and the portion that is not subjected to the plasma treatment may become the non-conductive portion 110. The uniformity of the non-conductive portion 110 of the transparent oxide layer 100 may be substantially the same as the uniformity of the transparent oxide material layer 100'. Further, since the transparent oxide layer 100 is formed by performing only plasma treatment on the transparent oxide material layer 100' without separate etching, the thickness of the transparent oxide material layer 100' may be substantially the same as the thickness of the transparent oxide layer 100. In other words, the conductive portion 130 and the non-conductive portion 110 of the transparent oxide layer 100 may be integrally formed to completely cover the first sub-display area SDAa.

Next, the photoresist is removed, and elements such as the first via insulating layer VIA1, the second via insulating layer VIA2, the light emitting element LEL, and the like are sequentially disposed to obtain the display device 1 illustrated in FIGS. 9, 10, and 11.

On the other hand, the transparent oxide layer 100 is able to secure a resistance value and light transmittance in a certain range required for driving the element. Hereinafter, the resistance value and the light transmittance of the transparent oxide layer 100 will be described.

Figure 19:
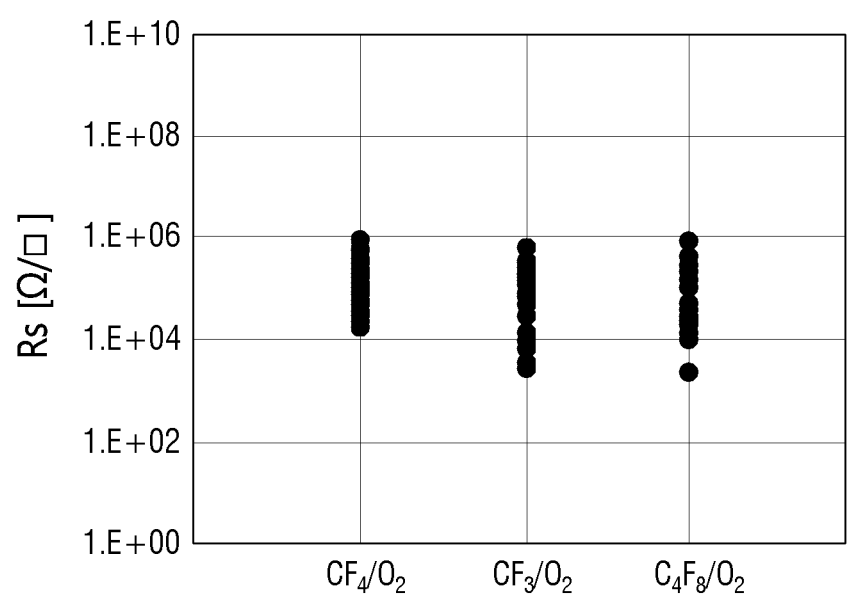
FIG. 19 is a graph of the measured resistance value of indium gallium zinc oxide having a thickness of 500 Å subjected to plasma treatment using a fluorine-based gas.
Figure 20:
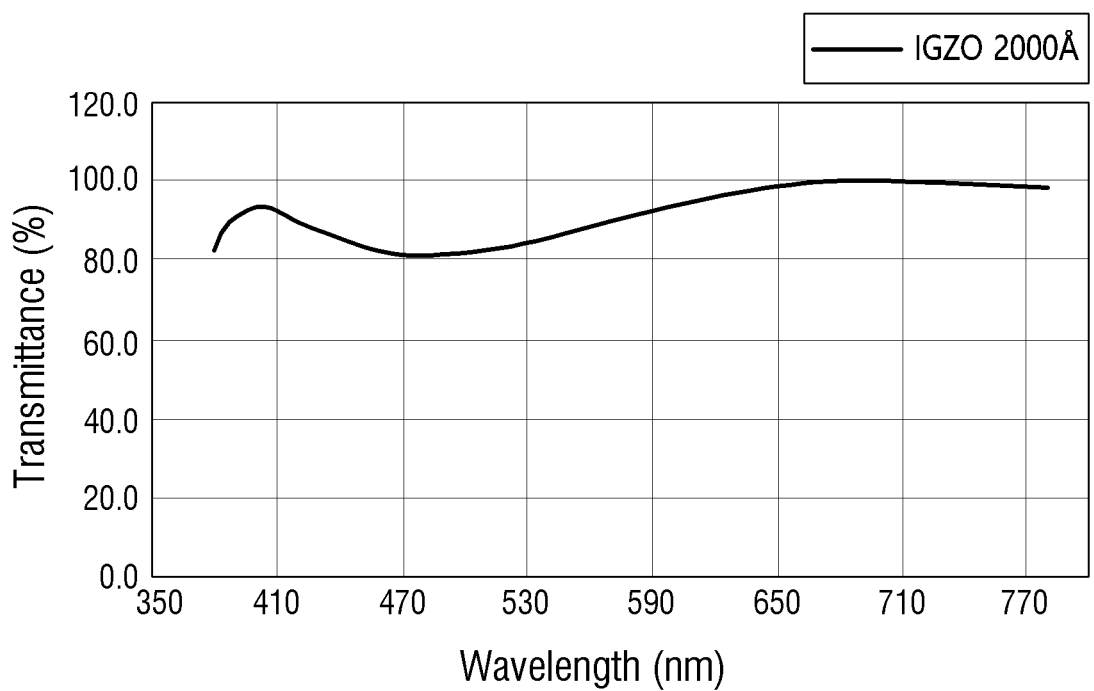
FIG. 20 is a graph of the measured light transmittance of indium gallium zinc oxide having a thickness of 2000 Å in a visible light region.

FIG. 19 is a graph of the measured resistance value of indium gallium zinc oxide having a thickness of 500 Å subjected to plasma treatment using a fluorine-based gas. FIG. 20 is a graph of the measured light transmittance of indium gallium zinc oxide having a thickness of 2000 Å in a visible light region.

Referring to FIG. 19, the graph illustrated in FIG. 19 shows the measured values of the electrical resistance of the conductive portion 130 formed by performing plasma treatment using $CF_4$, $CHF_3$, or $C_4F_8$ on the transparent oxide material layer 100' having a thickness of 500 Å. Specifically, in the case of performing plasma treatment using $CF_4$, the electrical resistance value of the transparent oxide layer 100 may be greater than or equal to $1.6 \times 10^4$ $\Omega/\square$ (ohms per square) and smaller than or equal to $9.8 \times 10^5$ $\Omega/\square$, in the case of performing plasma treatment using $CHF_3$, the electrical resistance value of the transparent oxide layer 100 may be greater than or equal to $2.8 \times 10^3$ $\Omega/\square$ and smaller than or equal to $6.6 \times 10^5$ $\Omega/\square$, and in the case of performing plasma treatment using $C_4F_8$, the electrical resistance value of the transparent oxide layer 100 may be greater than or equal to $2.5 \times 10^3$ $\Omega/\square$ and smaller than or equal to $9.8 \times 10^5$ $\Omega/\square$ or less.

In general, the resistance value of the line required for driving the element may be within a range of 600 $\Omega/\square$ to 700 Ω/□. Therefore, if the thickness of the transparent oxide material is increased and the process conditions are optimized, it is possible to obtain the resistance value of the line required to drive the element by performing plasma treatment using $CF_4$, $CHF_3$, or $C_4F_8$ on the transparent oxide material layer 100'. For example, when the thickness of the transparent oxide material layer 100' is increased to 2000 Å, the resistance value is lowered to about ¼ to ⅕. Therefore, in the case of performing plasma treatment using $CHF_3$, the electrical resistance value of the transparent oxide layer 100 having a thickness of 2000 Å may be smaller than or equal to 700 Ω/□.

In some embodiments, the thickness of the transparent oxide material layer 100' may be greater than or equal to 1500 Å and smaller than or equal to 2000 Å, but the disclosure is not limited thereto. When the plasma treatment time is increased to further improve the uniformity, the required resistance value may be secured even when the transparent oxide material layer 100' is formed to have a thickness smaller than or equal to 2000 Å. However, when the thickness of the transparent oxide material layer 100' is smaller than or equal to 1500 Å, it may be difficult to secure a required resistance value due to its thin thickness even if the process conditions are optimized.

On the other hand, when the thickness of the transparent oxide layer 100 is increased, the light transmittance to be described later is decreased, so that the thickness of the transparent oxide layer 100 may be smaller than or equal to 2000 Å to satisfy the light transmittance of the element required in the first sub-display area SDAa. The light transmittance of the element required in the first sub-display area SDAa may be at least 80% or more to secure external light reaching the optical device 740.

Referring to FIG. 20, the transparent oxide layer 100 having a thickness of 2000 Å may have a light transmittance of 80% or more in a visible light region. That is, since the transparent oxide layer 100 having a thickness of 2000 Å may have a light transmittance of 80% or more in a visible light region, the required light transmittance may be satisfied.

With the above configuration, the display device 1 according to one embodiment may prevent a light diffraction phenomenon while satisfying both the light transmittance and the resistance value in an area where a screen is displayed and light is transmitted.

Hereinafter, other embodiments of the display device 1 will be described. In the following embodiments, description of the same components as those of the above-described embodiment, which are denoted by like reference numerals, will be omitted or simplified, and differences will be mainly described.

Figure 21:
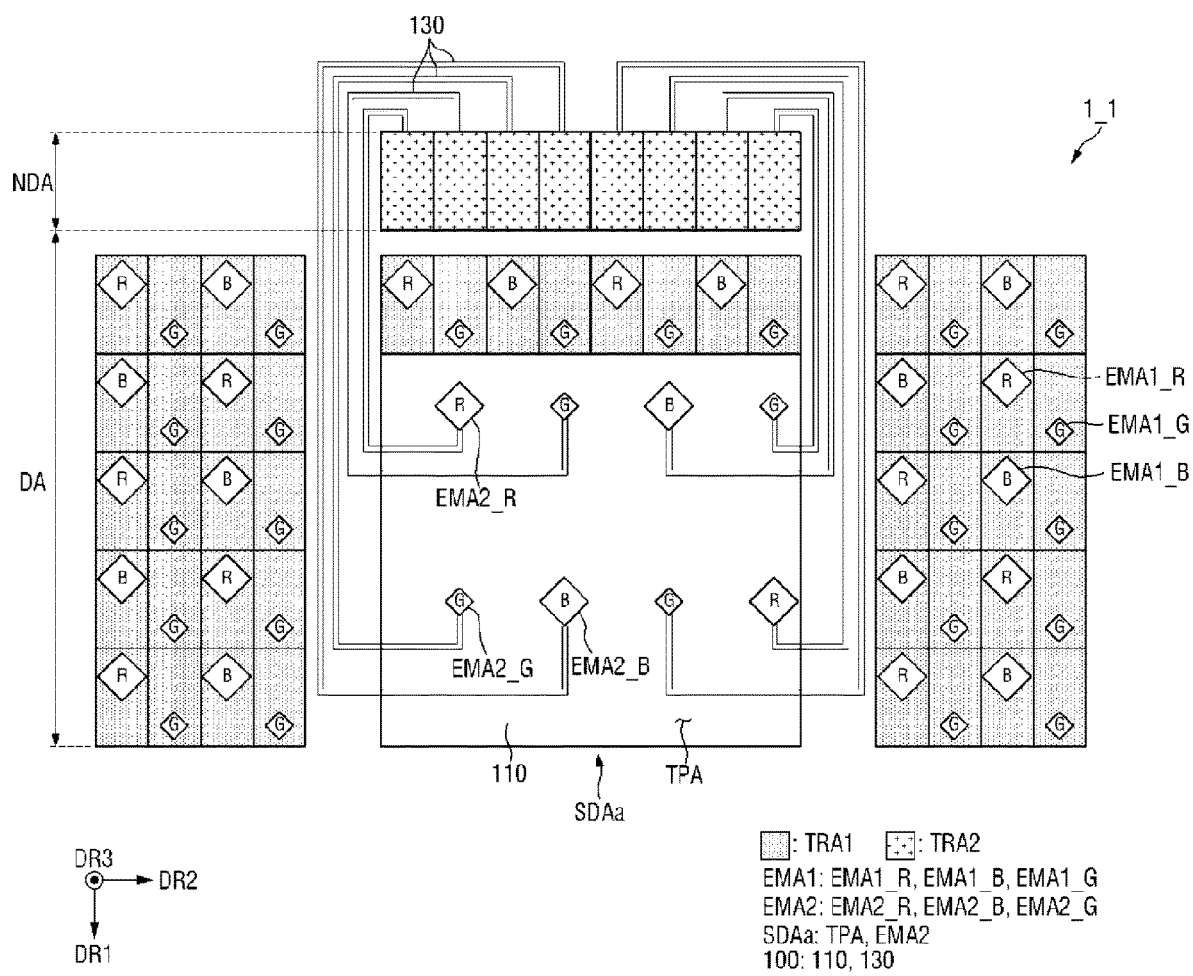
FIG. 21 is a plan view schematically illustrating arrangement of sub-pixels of a display device according to another embodiment.

FIG. 21 is a plan view schematically illustrating arrangement of sub-pixels of a display device according to another embodiment.

Referring to FIG. 21, in a display device 1_1 according to the present embodiment, the second transistor unit TRA2 may be disposed in a non-display area. Specifically, the display device 1_1 according to the present embodiment may have a configuration in which the second sub-display area SDAb is omitted, the main display area MDA is surrounded by the first sub-display area SDAa, and the second transistor unit TRA2 is disposed in the non-display area NDA and electrically connected to the second light emitting element LEL2.

Accordingly, the display area DA has a higher pixel per inch at a portion adjacent to the first sub-display area SDAa, which may result in a higher resolution.

Figure 22:
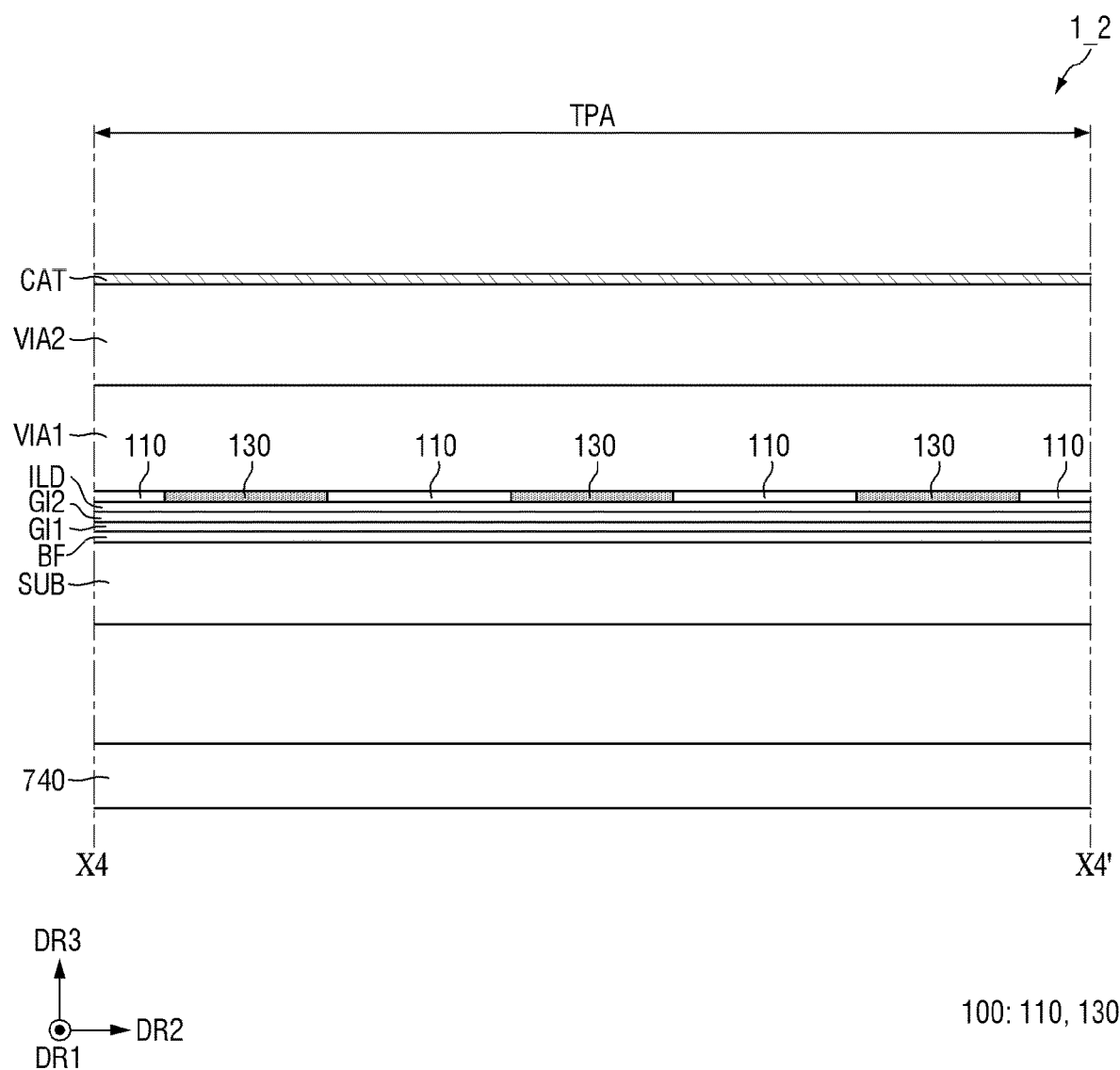
FIG. 22 is a cross-sectional view illustrating the stacked structure of a display device according to still another embodiment.

FIG. 22 is a cross-sectional view illustrating the stacked structure of a display device according to still another embodiment.

Referring to FIG. 22, in a display device 1_2 according to the present embodiment, the insulating layer on the buffer layer BF may not be etched in the first sub-display area SDAa. Specifically, the display device 1_2 according to the present embodiment may include the substrate SUB, the buffer layer BF, the first gate insulating layer GI1, the second gate insulating layer GI2, the interlayer insulating layer ILD, the transparent oxide layer 100, the first via insulating layer VIA1, the second via insulating layer VIA2, and the cathode electrode CAT in the light transmitting part TPA of the first sub-display area SDAa.

Accordingly, the element durability in the first sub-display area SDAa may be improved.

Figure 23:
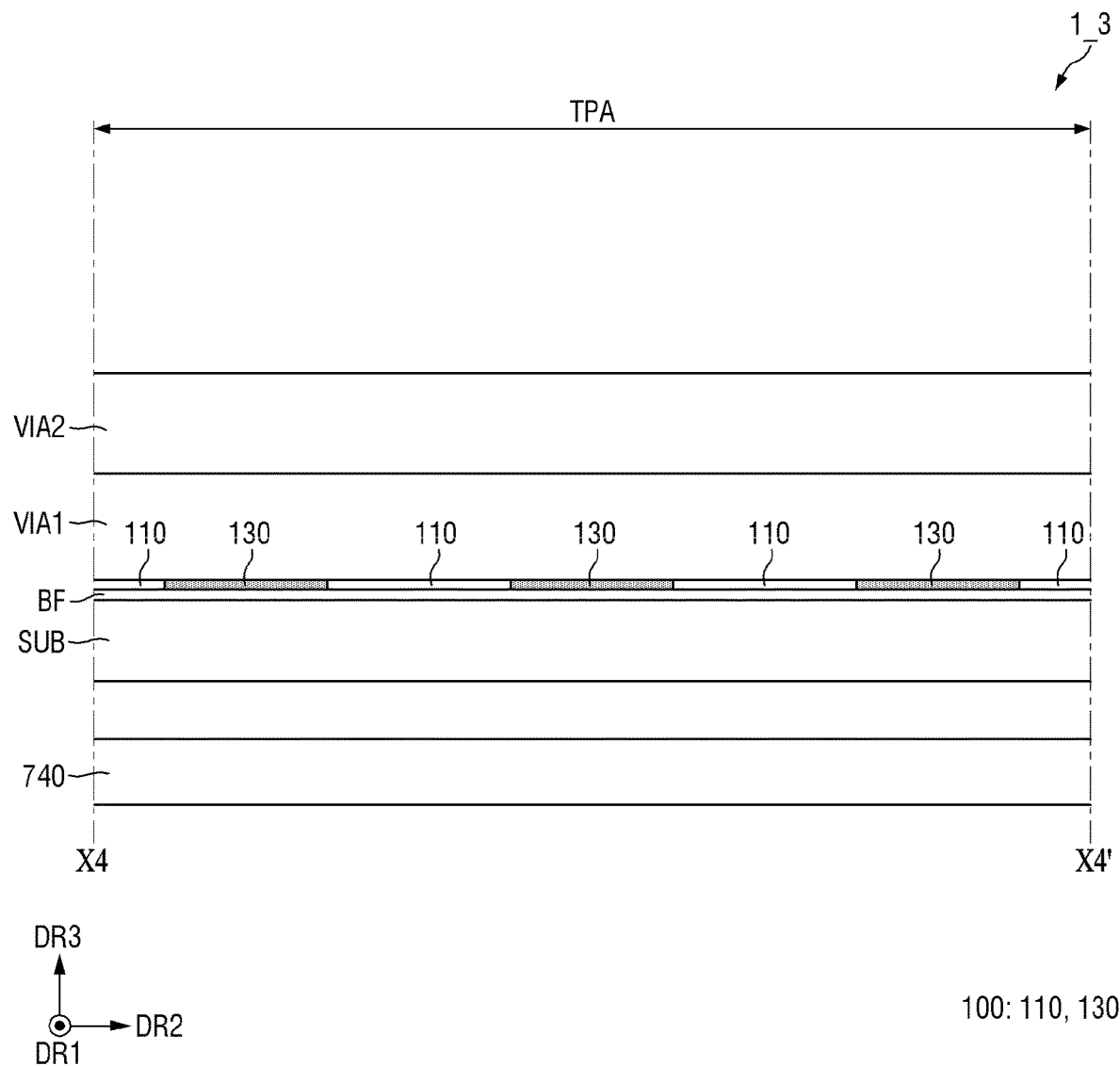
FIG. 23 is a cross-sectional view illustrating the stacked structure of a display device according to still another embodiment.

FIG. 23 is a cross-sectional view illustrating the stacked structure of a display device according to still another embodiment.

Referring to FIG. 23, in a display device 1_3 according to the present embodiment, the cathode electrode CAT on the second via insulating layer VIA2 may be removed by etching at the light transmitting part TPA of the first sub-display area SDAa. Specifically, the display device 1_3 according to the present embodiment may include the substrate SUB, the buffer layer BF, the transparent oxide layer 100, the first via insulating layer VIA1, and the second via insulating layer VIA2 in the light transmitting part TPA of the first sub-display area SDAa. In this case, the thin film encapsulation layer may be disposed on the second via insulating layer VIA2 at the light transmitting part TPA of the first sub-display area SDAa.

Accordingly, the light transmittance in the first sub-display area SDAa may be improved.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising: a substrate including a first sub-display area and a main display area surrounding the first sub-display area; a first transistor disposed on the main display area of the substrate without overlapping the first sub display area; a via insulating layer disposed on the substrate to cover the first transistor; a first light emitting element disposed on the via insulating layer to overlap the main display area without overlapping the first sub display area; a second light emitting element disposed on the via insulating layer to overlap the first sub-display area without overlapping the main display area; and a transparent oxide layer disposed under the via insulating layer to overlap the first sub-display area without overlapping the main display area, wherein the transparent oxide layer includes a conductive portion and a non-conductive portion the first light emitting element is disposed to overlap the first transistor in the main display area while being electrically connected thereto, the second light emitting element is electrically connected to the conductive portion of the transparent oxide layer in the first sub-display area, the non-conductive portion is in direct contact with the conductive portion and a bottom surface of the via insulating layer and the conductive portion and the non-conductive portion include the same material.

2. The display device of claim 1,
further comprising a second transistor disposed in the second sub-display area of the substrate without overlapping the first sub-display area,
wherein the substrate further includes a second sub-display area disposed adjacent to the first sub-display area and surrounded by the main display area,
the second transistor is disposed between the substrate and the via insulating layer and is electrically connected to the conductive portion by a connection electrode passing through the via insulating layer, and
the second light emitting element is electrically connected to the second transistor by the conductive portion without overlapping the second transistor.

3. The display device of claim 1,
wherein the transparent oxide layer includes indium gallium zinc oxide, and
a thickness of each of the conductive portion and the non-conductive portion of the transparent oxide layer has a value greater than or equal to 1500 Å and smaller than or equal to 2000 Å.

4. The display device of claim 2,
wherein the second sub-display area includes:
a first area in which the first transistor and the first light emitting element are disposed; and
a second area in which the second transistor is disposed, and
wherein the transparent oxide layer does not overlap the first transistor.

5. The display device of claim 2,
further comprising a buffer layer disposed on the substrate,
wherein in the first sub-display area, the transparent oxide layer is in direct contact with a top surface of the buffer layer.

6. The display device of claim 4, wherein the second transistor includes a drain electrode spaced apart from the transparent oxide layer,
the connection electrode is disposed on the via insulating layer to overlap the second transistor; and
the connection electrode is electrically connected to the drain electrode through a first contact hole penetrating the via insulating layer, and is electrically connected to the conductive portion of the transparent oxide layer through a second contact hole penetrating the via insulating layer while being spaced apart from the first contact hole.

7. The display device of claim 5,
wherein the transparent oxide layer completely covers the first sub-display area.

8. The display device of claim 5,
further comprising an optical device disposed under the substrate,
wherein the optical device overlaps the first sub-display area.

9. The display device of claim 6,
wherein an area occupied by the non-conductive portion of the transparent oxide layer is larger than an area occupied by the conductive portion.

10. The display device of claim 1,
wherein a refractive index of the conductive portion is substantially equal to a refractive index of the non-conductive portion.

11. The display device of claim 3,
wherein an electrical resistance of the conductive portion of the transparent oxide layer has a value greater than or equal to 600 Ω/□ (ohms per square) and smaller than or equal to 700 Ω/□.

12. The display device of claim 3,
wherein each of the conductive portion and the non-conductive portion has a light transmittance of 80% or more in a visible light region.

13. A display device comprising:
a substrate;
a via insulating layer disposed on the substrate;
a light emitting element disposed on the via insulating layer;
a conductive portion disposed between the substrate and the via insulating layer and in direct contact with a bottom surface of the via insulating layer; and
a non-conductive portion in direct contact with the conductive portion and a bottom surface of the via insulating layer,
wherein the light emitting element is electrically connected to the conductive portion, and
the conductive portion and the non-conductive portion include a same material.

14. The display device of claim 13,
wherein the light emitting element includes a first light emitting element and a second light emitting element spaced apart from the first light emitting element,
the conductive portion includes a first conductive portion electrically connected to the first light emitting element and a second conductive portion electrically connected to the second light emitting element,
a light transmitting part is disposed between the first light emitting element and the second light emitting element, and
the non-conductive portion is disposed between the first conductive portion and the second conductive portion to overlap the light transmitting part.

15. The display device of claim 13,
wherein a thickness of the conductive portion and a thickness of the non-conductive portion are substantially the same, and
a bottom surface of the conductive portion and a bottom surface of the non-conductive portion are disposed on one plane.

16. The display device of claim 13,
wherein the conductive portion and the non-conductive portion comprise indium gallium zinc oxide, and
a thickness of each of the conductive portion and the non-conductive portion has a value greater than or equal to 1500 Å and smaller than or equal to 2000 Å.

17. The display device of claim 15,
wherein the conductive portion and the non-conductive portion are disposed under the via insulating layer to cover an entirety of a bottom surface of the via insulating layer.

18. The display device of claim 17,
wherein uniformity of the conductive portion is higher than uniformity of the non-conductive portion.

19. The display device of claim 17,
wherein a refractive index of the conductive portion is substantially equal to a refractive index of the non-conductive portion.

* * * * *